(12) United States Patent
Hsu et al.

(10) Patent No.: US 6,884,724 B2
(45) Date of Patent: Apr. 26, 2005

(54) METHOD FOR DISHING REDUCTION AND FEATURE PASSIVATION IN POLISHING PROCESSES

(75) Inventors: Wei-Yung Hsu, Santa Clara, CA (US); Liang-Yuh Chen, Foster City, CA (US); Ratson Morad, Palo Alto, CA (US); Daniel A. Carl, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/939,323

(22) Filed: Aug. 24, 2001

(65) Prior Publication Data

US 2003/0040188 A1 Feb. 27, 2003

(51) Int. Cl.$^7$ ............................................. H01L 21/20
(52) U.S. Cl. ........................ 438/692; 438/643; 438/645; 438/672; 438/697; 438/699
(58) Field of Search ................................. 438/643, 645, 438/672, 692, 697, 699

(56) References Cited

U.S. PATENT DOCUMENTS

| | | | |
|---|---|---|---|
| 5,578,523 A | 11/1996 | Fiordalice et al. | 437/190 |
| 5,804,084 A | 9/1998 | Nasby et al. | 216/2 |
| 5,804,507 A | 9/1998 | Perlov et al. | 438/692 |
| 5,880,003 A | 3/1999 | Hayashi | 438/405 |
| 5,897,375 A | 4/1999 | Watts et al. | 438/693 |
| 5,928,959 A | 7/1999 | Huckels et al. | 438/691 |
| 5,928,961 A | 7/1999 | Lou et al. | 438/692 |
| 5,968,842 A | 10/1999 | Hsiao | 438/692 |
| 6,010,962 A | 1/2000 | Liu et al. | 438/687 |
| 6,017,803 A | 1/2000 | Wong | 438/430 |
| 6,083,840 A | 7/2000 | Mravic et al. | 438/693 |
| 6,136,693 A | 10/2000 | Chan et al. | 438/633 |
| 6,140,234 A | 10/2000 | Uzoh et al. | 438/678 |
| 6,225,223 B1 * | 5/2001 | Liu et al. | 438/687 |
| 6,258,220 B1 | 7/2001 | Dordi et al. | 204/198 |
| 6,341,998 B1 * | 1/2002 | Zhang | 451/41 |
| 6,376,353 B1 * | 4/2002 | Zhou et al. | 438/687 |
| 6,420,258 B1 * | 7/2002 | Chen et al. | 438/643 |
| 6,451,698 B1 * | 9/2002 | Au et al. | 438/692 |
| 6,455,425 B1 | 9/2002 | Besser et al. | |
| 6,489,240 B1 * | 12/2002 | Iacoponi et al. | 438/692 |
| 6,582,579 B1 | 6/2003 | Uzoh | |
| 2002/0127845 A1 * | 9/2002 | Farrar | 438/627 |

FOREIGN PATENT DOCUMENTS

WO 01/78135 A2 10/2001

OTHER PUBLICATIONS

U.S. Appl. No. 09/698,864, filed Oct. 27, 2000, Sun et al.
U.S. Appl. No. 09/569,968, filed May 11, 2000, Sun et al.
U.S. Appl. No. 09/547,189, filed Apr. 11, 2000, Ettinger et al.

* cited by examiner

Primary Examiner—Robert Kunemund
(74) Attorney, Agent, or Firm—Moser, Patterson & Sheridan

(57) ABSTRACT

Methods and apparatus for planarizing a substrate surface are provided. In one aspect, a method is provided for planarizing a substrate surface including polishing a first conductive material to a barrier layer material, depositing a second conductive material on the first conductive material by an electrochemical deposition technique, and polishing the second conductive material and the barrier layer material to a dielectric layer. In another aspect, a processing system is provided for forming a planarized layer on a substrate, the processing system including a computer based controller configured to cause the system to polish a first conductive material to a barrier layer material, deposit a second conductive material on the first conductive material by an electrochemical deposition technique, and polish the second conductive material and the barrier layer material to a dielectric layer.

31 Claims, 10 Drawing Sheets

METHOD FOR DISHING REDUCTION AND FEATURE PASSIVATION IN POLISHING PROCESSES

BACKGROUND OF THE INVENTION

1. Field of the Invention

The present invention generally relates to the fabrication of semiconductor devices and to chemical mechanical polishing, deposition, and planarization of semiconductor devices.

2. Background of the Related Art

Reliably producing sub-half micron and smaller features is one of the key technologies for the next generation of very large scale integration (VLSI) and ultra large-scale integration (ULSI) of semiconductor devices. However, as the fringes of circuit technology are pressed, the shrinking dimensions of interconnects in VLSI and ULSI technology has placed additional demands on the processing capabilities. The multilevel interconnects that lie at the heart of this technology require precise processing of high aspect ratio features, such as vias, contacts, lines, and other interconnects. Reliable formation of these interconnects is important to VLSI and ULSI success and to the continued effort to increase circuit density and quality of individual substrates and die.

To further improve the current density of semiconductor devices on integrated circuits, it has become necessary to use conductive materials having low resistivity for conductors. One conductive material gaining acceptance is copper and its alloys, which have become the materials of choice for sub-quarter-micron interconnect technology because copper has a lower resistivity than aluminum, (1.7 $\mu\Omega$-cm compared to 3.1 $\mu\Omega$-cm for aluminum), and a higher current carrying capacity. These characteristics are important for supporting the higher current densities experienced at high levels of integration and increased device speed. Further, copper has a good thermal conductivity and is available in a highly pure state.

One difficulty in using copper in semiconductor devices is that copper is difficult to etch and achieve a precise pattern. Etching with copper using traditional deposition/etch processes for forming interconnects has been less than satisfactory. Therefore, new methods of manufacturing interconnects having copper containing materials are being developed.

One method for forming vertical and horizontal interconnects is by a damascene or dual damascene method. In the damascene method, one or more dielectric materials, such as the low k dielectric materials, are deposited and pattern etched to form the vertical interconnects, i.e. vias, and horizontal interconnects, i.e., lines. Conductive materials, such as copper, and other materials, such as barrier layer materials used to prevent diffusion of conductive material into the surrounding low k dielectric, are then inlaid into the etched pattern. Any excess conductive material and excess barrier layer material external to the etched pattern, such as on the field of the substrate, is then removed. Barrier layer materials include, for example, tantalum (Ta), tantalum nitride (TaN), titanium (Ti), and titanium nitride.

As layers of materials are sequentially deposited and removed, the uppermost surface of the substrate may become non-planar across its surface and require planarization. Planarizing a surface, or "polishing" a surface, is a process where material is removed from the surface of the substrate to form a generally even, planar surface. Planarization is useful in damascene processes to remove excess deposited material and to provide an even surface for subsequent levels of metallization and processing. Planarization may also be used in removing undesired surface topography and surface defects, such as rough surfaces, agglomerated materials, crystal lattice damage, scratches, and contaminated layers or materials.

Chemical mechanical planarization, or chemical mechanical polishing (CMP), is a common technique used to planarize substrates. In conventional CMP techniques, a substrate carrier or polishing head is mounted on a carrier assembly and positioned in contact with a polishing pad in a CMP apparatus. The carrier assembly provides a controllable pressure to the substrate urging the substrate against the polishing pad. The pad is moved relative to the substrate by an external driving force. Thus, the CMP apparatus effects polishing or rubbing movement between the surface of the substrate and the polishing pad while dispersing a polishing composition to effect both chemical activity and mechanical activity.

Conventionally, in polishing copper features, such as dual damascene features, the copper material is polished to the barrier layer, and then the barrier layer is polished to the underlying dielectric layer. However, the interface between copper and the barrier layer is generally non-planar and copper materials and the barrier materials are often removed from the substrate surface at different rates, which can result in the retention of copper material, or residue, on the surface of the substrate. To ensure removal of all the copper material and residue before removing the barrier material, it is necessary to overpolish the copper at the interface. Overpolishing of copper at the interface can result in forming topographical defects, such as concavities, recesses, or depressions, referred to as dishing, in copper features.

FIG. 1 is a schematic view of a substrate illustrating the phenomenon of dishing. Conductive lines 12 and 14 are formed by depositing conductive materials, such as copper or copper alloy, in a feature definition formed in the dielectric layer 10, typically comprised of silicon oxides or other dielectric materials. After planarization, a portion of the conductive material is depressed by an amount D, referred to as the amount of dishing, forming a recess 16 in the copper surface. Dishing results in a non-planar surface that impairs the ability to print high-resolution lines during subsequent photolithographic steps and detrimentally affects subsequent surface topography of the substrate and device formation. Dishing also detrimentally affects the performance of devices by lowering the conductance and increasing the resistance of the devices, contrary to the benefit of using higher conductive materials, such as copper.

Therefore, there exists a need for a method and apparatus that planarizes a substrate surface with minimal or reduced dishing of the substrate surface.

SUMMARY OF THE INVENTION

The invention generally provides a method and apparatus for planarizing a substrate surface to minimize dishing of substrate features. In one aspect, a method is provided for processing a substrate including providing a substrate with feature definitions formed in a dielectric material, depositing a barrier layer material on a substrate surface and in the feature definitions, depositing a first conductive material on the barrier layer material to fill the feature definitions, polishing the first conductive material to at least a top surface of the barrier layer material, depositing a second conductive material by an electrochemical deposition technique on at least the first conductive material to fill recesses formed in the first conductive material, and polishing the second conductive material and the barrier layer material to at least a top surface of the dielectric layer to form a planar surface.

In another aspect, a method is provided for planarizing a substrate surface including providing a substrate to a polishing station disposed on a processing system, wherein the substrate comprises a dielectric material with substrate feature definitions formed therein, a barrier layer material disposed thereon and within the feature definitions, and a copper material disposed on the barrier layer material, polishing the copper material from the substrate surface to at least a top surface of the barrier layer material, transferring the substrate to an electrochemical deposition and polishing station disposed on the polishing system, depositing a conductive material selectively on the copper containing material by an electroless deposition technique while removing the conductive material and the barrier layer material to at least a top surface of the dielectric layer by a polishing technique.

In another aspect, a processing system is provided for forming a planarized layer on a substrate surface including a processing platform having two or more processing stations, a loading station, and a substrate transfer device disposed above the processing stations and the loading station, wherein at least one of the processing stations is adapted to polish a substrate surface, wherein at least one of the processing stations is adapted to deposit a material by an electrochemical process, and a computer based controller configured to cause the system to polish a first conductive material from the substrate surface to a barrier layer material, deposit a second conductive material on the first conductive material by an electrochemical deposition technique, and polish the second conductive material and the barrier layer material to at least the top surface of a dielectric layer.

Another aspect of the invention provides a substrate processing chamber adapted for processing a substrate including a substrate support, comprising a substrate receiving surface, a vacuum port, vacuum grooves in communication with the vacuum port, and a fluid source, a fluid input coupled to the fluid source and adapted to deliver a processing fluid to a substrate disposed on the substrate receiving surface, and a fluid output adapted to drain the processing fluid from the processing chamber. The substrate processing chamber may further include a polishing head assembly including polishing media and a polishing media support.

The substrate processing chamber may be disposed in an electrochemical deposition system including a mainframe having a mainframe wafer transfer robot, a loading station disposed in connection with the mainframe, one or more polishing platens disposed in connection with the mainframe, an electrolyte supply fluidly connected to the substrate processing chamber, and one or more polishing fluid supplies connected to the one or more polishing platens

BRIEF DESCRIPTION OF THE DRAWINGS

So that the manner in which the above recited aspects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention, and the drawings are therefore not to be considered limiting of the scope of the invention because the invention may admit to other equally effective embodiments.

DETAILED DESCRIPTION OF THE PREFERRED EMBODIMENT

In general, aspects of the invention provide a method and apparatus for reducing or minimizing dishing and recess formation from polishing of conductive materials, such as copper. The invention will be described below in reference to treating a substrate surface between chemical mechanical polishing (CMP) techniques and electrochemical deposition techniques. CMP is broadly defined herein as polishing a substrate by chemical activity, mechanical activity, or a combination of both chemical and mechanical activity. Electrochemical deposition processes are broadly described herein by the deposition of material by an electron exchange mechanism, such as by a chemical reduction method.

Figure 2:
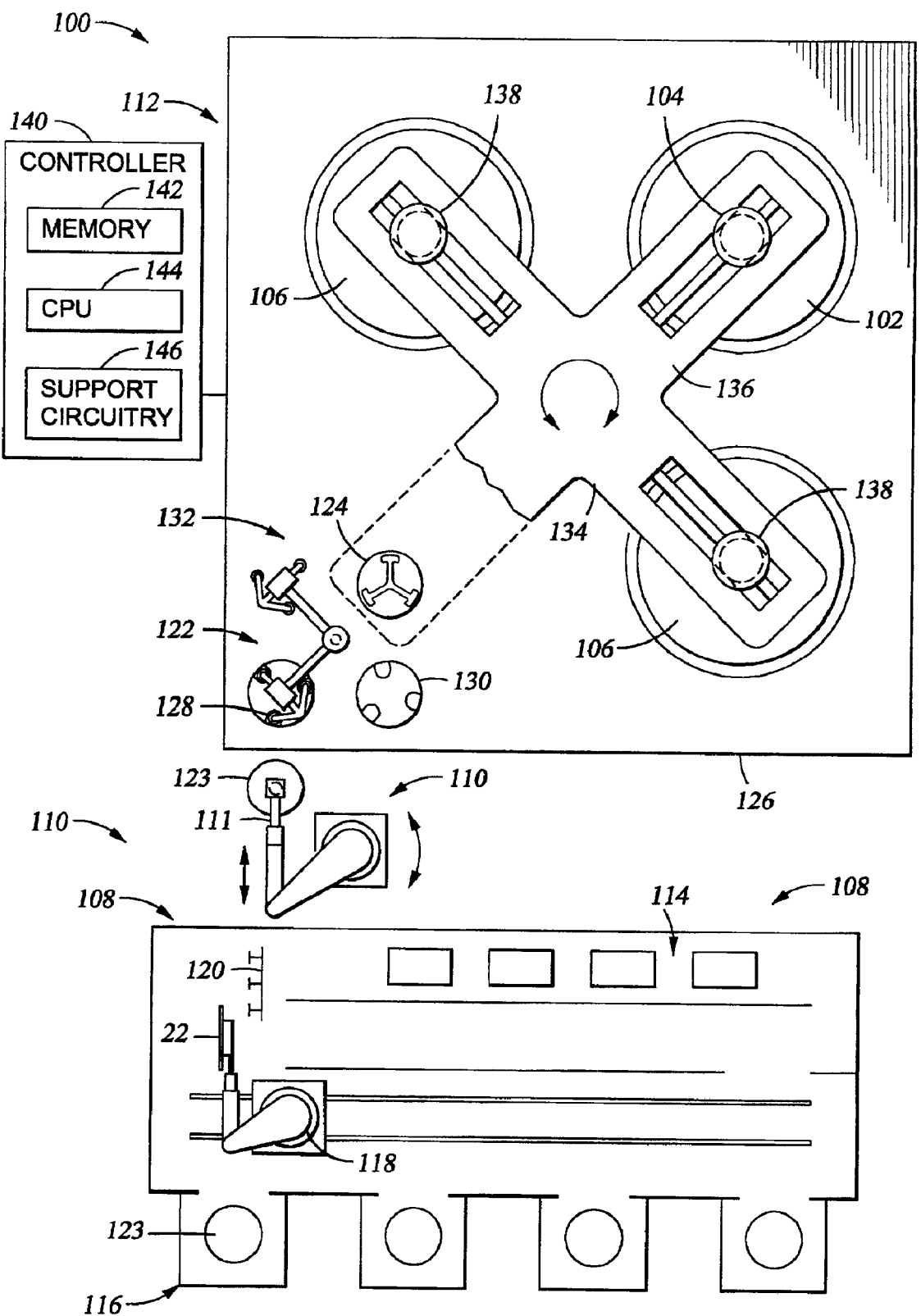
FIG. 2 is a plan view of one embodiment of a processing platform incorporating embodiments of the processing apparatus of the invention.

FIG. 2 depicts one embodiment of a processing system 100 having at least one electrochemical processing station 102 and at least one conventional polishing or buffing station 106 for performing the processes described herein. One polishing tool that may be adapted to benefit from the invention is a MIRRA MESA® chemical mechanical polisher available from Applied Materials, Inc. located in Santa Clara, Calif. The exemplary system 100 generally comprises a factory interface 108, a loading robot 110, and a depositing and planarizing module 112. Generally, the loading robot 110 is disposed proximate the factory interface 108 and the depositing and planarizing module 112 to facilitate the transfer of substrates 122 therebetween.

The factory interface 108 generally includes a cleaning module 114 and one or more substrate cassettes 116. An interface robot 118 is employed to transfer substrates 123 between the substrate cassettes 116, the cleaning module 114 and an input module 120. The input module 120 is positioned to facilitate transfer of substrates 123 between the depositing and planarizing module 112 and the factory interface 108 by the loading robot 110.

Processed substrates 123 are typically passed from the input module 120 through the cleaning module 114 before the factory interface robot 118 returns the cleaned substrates 123 to the cassettes 116. An example of such a factory interface 108 that may be used to advantage is disclosed in U.S. patent application Ser. No. 09/547,189, filed Apr. 11, 2000 assigned to common assignee Applied Materials, Inc., and which is hereby incorporated by reference.

The loading robot 110 is generally positioned proximate the factory interface 108 and the depositing and planarizing module 112 such that the range of motion provided by the robot 110 facilitates transfer of the substrates 123 therebetween. An example of a loading robot 110 is a 4-Link robot, manufactured by Kensington Laboratories, Inc., located in Richmond, Calif. The exemplary loading robot 110 has a gripper 111 that may orientate the substrate 123 in either a vertical or a horizontal orientation.

The exemplary depositing and planarizing module 112 has a transfer station 122 and a carousel 134 in addition to the electrochemical processing station 102 and the polishing station 106, all of which are disposed on a machine base 126. The depositing and planarizing module 112 may comprise one or more processing stations, such as one or more polishing stations and one or more electrochemical processing stations. In a further alternative, a polishing module 112 may be provided for polishing a substrate following processing by the methods described herein or in the apparatus described herein.

In one embodiment, the transfer station 122 comprises at least an input buffer station 128, an output buffer station 130, a transfer robot 132, and a load cup assembly 124. The transfer robot 132 has two gripper assemblies, each having pneumatic gripper fingers that grab the substrate 123 by the substrate's edge. The transfer robot 132 lifts the substrate 123 from the input buffer station 128 and rotates the gripper and substrate 123 to position the substrate 123 over the load cup assembly 134, then places the substrate 123 down onto the load cup assembly 124. An example of a transfer station that may be used to advantage is described by Tobin in U.S. patent application Ser. No. 09/314,771, filed Oct. 10, 1999, assigned to common assignee Applied Materials, Inc., and which is hereby incorporated by reference.

The carousel 134 is generally described in U.S. Pat. No. 5,804,507, issued Sep. 8, 1998 to Tolles et al. and is hereby incorporated herein by reference in its entirety. Generally, the carousel 134 is centrally disposed on the base 126. The carousel 134 typically includes a plurality of arms 136. The arms 136 generally each supporting a polishing head 138 while one arm supports a carrier head assembly 104. One of the arms 136 depicted in FIG. 2 is shown in phantom such that the transfer station 122 may be seen. The carousel 134 is indexable such that the polishing head 138 and carrier head assembly 104 may be moved between the modules 102, 106 and the transfer station 122.

Generally the polishing head 138 retains the substrate 123 while pressing the substrate against a polishing material (not shown) disposed on the polishing stations 106. One polishing head that may be utilized is a TITAN HEAD™ substrate carrier manufactured by Applied Materials, Inc., Santa Clara, Calif.

The arrangement of the electrochemical processing stations 102 and polishing stations 106 on the depositing and planarizing module 112 allow for the substrate 123 to be sequentially plated or polishing by moving the substrate between processing stations. The substrate 123 may be processed in each station 102, 106 while remaining in it respective head or carrier assembly 104, 138, or the substrate may be switched between heads by offloading the substrate from one head into the load cup and loading into the substrate into the other polishing head. Optionally, the depositing and planarizing module 112 may comprise only one type of head may be utilized (i.e., all polishing heads 138 or all carrier heads 104).

Further, while not shown, a computer system or computer based controller or a computer program-product may be connected to the system 100 for instructing the system to perform one or more processing steps on the system, such as polishing a substrate, electrochemical depositing material on a substrate, or transferring a substrate in the system 100.

Programs defining functions of aspects of the invention can be provided to a computer via a variety of signal-bearing media and/or computer readable media, which include but are not limited to, (i) information permanently stored on nonwritable storage media (e.g. read-only memory devices within a computer such as read only CD-ROM disks readable by a CD-ROM or DVD drive; (ii) alterable information stored on a writable storage media (e.g. floppy disks within diskette drive or hard-disk drive); or (iii) information conveyed to a computer by communications medium, such as through a computer or telephone network, including wireless communication.

Such signal-bearing media, when carrying computer-readable instructions that direct the functions of the invention, represent alternative aspects of the invention. It may also be noted that portions of the product program may be developed and implemented independently, but when combined together are aspects of the invention.

To facilitate control of the system 100 as described above, computer based controller 140 may be a CPU 144 or one of any form of computer processor that can be used in an industrial setting for controlling various chambers and sub-processors. Memory 142 is coupled to the CPU 144 and the memory, or computer-readable medium, may be one or more of readily available memory such as random access memory (RAM), read only memory (ROM), floppy disk, hard disk, or any other form of digital storage, local or remote. Support circuits 146 are coupled to the CPU 144 for supporting the processor in a conventional manner. These circuits include cache, power supplies, clock circuits, input/output circuitry and subsystems, and the like. Process sequences, such as by aspects of the processes described herein, is generally stored in the memory, typically as a software routine. The software routine may also be stored and/or executed by a second CPU (not shown) that is remotely located from the hardware being controlled by the CPU 144.

Figure 3:
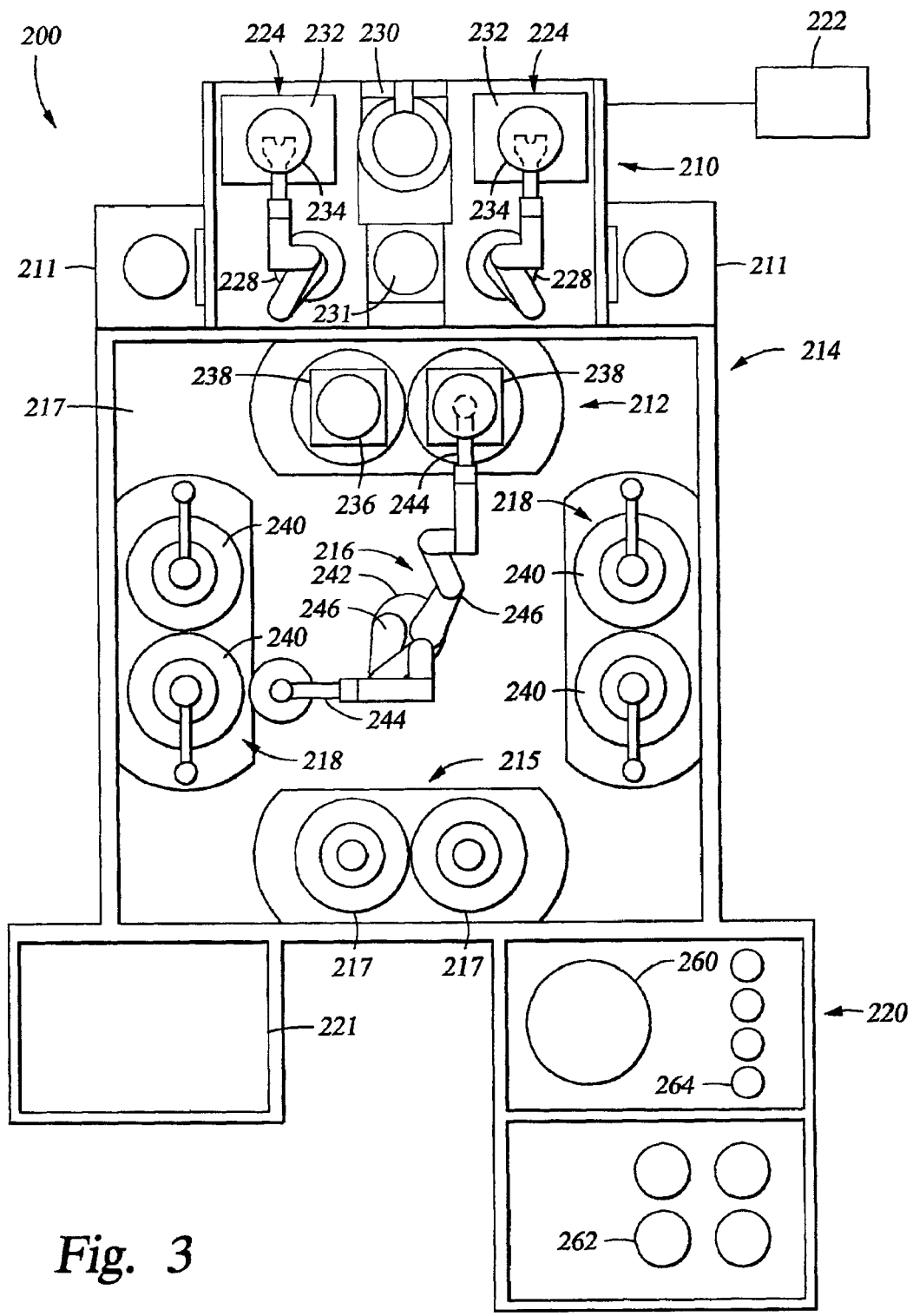
FIG. 3 is a plan view of another embodiment of a processing platform incorporating embodiments of the processing apparatus of the invention.

Another system useful for performing the processes described herein is shown in FIG. 3. FIG. 3 depicts a schematic top view of another embodiment of a processing system 200 having at least one electrochemical processing station 218 and at least one conventional polishing station 215 for performing the processes described herein. One tool that may be adapted to benefit from the invention is an ELECTRA® processing system available from Applied Materials, Inc. located in Santa Clara, Calif. An example of a suitable electroplating tool is described in copending U.S. patent application Ser. No. 09/289,074, filed on Apr. 8, 2000, assigned to common assignee Applied Materials, Inc., and which is incorporated by reference herein to the extent not inconsistent with the invention.

The system 200, an electroplating system platform, generally comprises a loading station 210, a mainframe 214, one or more electrochemical processing stations 218, one or more polishing stations 215. The system may also contain a thermal anneal chamber 211, an electrolyte replenishing system 220, and one or more substrate pass-through cassettes 238.

The mainframe 214 generally comprises a mainframe transfer station 216, a spin-rinse dry (SRD) station 212, a plurality of electrochemical processing stations 218, and one or more polishing stations 215. The system 200, particularly the mainframe 214, is enclosed in a clean environment using panels such as Plexiglas panels. The mainframe 214 includes a base having cutouts to support various stations needed to complete the electrochemical deposition process.

Each processing station 218 includes one or more electrochemical processing cells 240. An electrolyte replenishing system 220 is positioned adjacent the mainframe 214 and connected to the process cells 240 individually to circulate electrolyte used for the electroplating process.

Each polishing station 215 comprises one or more polishing platens 217. The polishing platens 217 may comprise a stationary polishing platen, a rotatable polishing platen, a linear polishing platen, a rotatable linear polishing platen, a roller polishing platen, or combinations thereof. Polishing media disposed on the polishing platens 217 may be conductive and/or contain abrasive elements or particles.

The system 200 also includes a power supply station 221 for providing electrical power to the system and a control system 222, typically comprising a programmable microprocessor. The power supply includes one or more power sources that may be connected to individual electrochemical cells 240 and polishing platens 217. The control system 222 is mounted above the mainframe 214 and comprises a programmable microprocessor. The programmable microprocessor is typically programmed using software designed specifically for controlling all components of the system 200. The control system 222 also provides electrical power to the components of the system and includes a control panel that allows an operator to monitor and operate the system 200. The control panel is a stand-alone module that is connected to the control system 222 through a cable and provides easy access to an operator. Generally, the control system 222 coordinates the operations of the various components of the system 200, such as the loading station 210, the RTA chamber 211, the SRD station 212, the mainframe 214, the processing stations 218 and 215, and the electrolyte replenishing system 220 to provide the electrolyte for the electroplating process.

The loading station 210 preferably includes one or more substrate cassette receiving areas 224, one or more loading station transfer robots 228 and at least one substrate orientor 230. A number of substrate cassette receiving areas, loading station transfer robots 228 and substrate orientor included in the loading station 210 can be configured according to the desired throughput of the system.

The system 200 has a modular design that allows for the replacement of components for a desired configuration for performing a process or sequence of processes. For example, the electrochemical processing stations 218 may be replaced with a polishing station 215, and vice versa.

Additionally, individual components of the stations, such as the one or more polishing platens 217 of the polishing stations 215, may be disposed at the locations of other processing components, such as the thermal anneal chamber 211 and one or more substrate pass-through cassettes 238. Alternative embodiment may have electroless deposition stations at the location of the one or more polishing stations 215 if the one or more polishing platens 217 are disposed at the locations of the thermal anneal chamber 211 and the one or more substrate pass-through cassettes 238.

As shown for one embodiment in FIG. 3, the loading station 210 includes two substrate cassette receiving areas 224, two loading station transfer robots 228 and one substrate orientor 230. A substrate cassette 232 containing substrates 234 is loaded onto the substrate cassette receiving area 224 to introduce substrates 234 into the system 200. The loading station transfer robot 228 transfers substrates 234 between the substrate cassette 232 and the substrate orientor 230. The loading station transfer robot 228 comprises a typical transfer robot commonly known in the art.

The substrate orientor 230 positions each substrate 234 in a desired orientation to ensure that the substrate is properly processed. The loading station transfer robot 228 also transfers substrates 234 between the loading station 210 and the SRD station 212 and between the loading station 210 and the thermal anneal chamber 211. The loading station 210 preferably also includes a substrate cassette 231 for temporary storage of substrates as needed to facilitate efficient transfer of substrates through the system.

FIG. 3 also shows a mainframe transfer robot 242 having a flipper robot 244 incorporated therein. The mainframe transfer robot 242 serves to transfer substrates between different stations attached to the mainframe station, including the electrochemical processing stations 218 and the polishing stations 215. The mainframe transfer robot 242 includes a plurality of robot arms 242 (two shown), and a flipper robot 244 is attached as an end effector for each of the robot arms 246. Flipper robots are generally known in the art and can be attached as end effectors for substrate handling robots, such as model RR701, available from Rorze Automation, Inc., located in Milpitas, Calif.

The main transfer robot 242 having a flipper robot 244 as the end effector is capable of transferring substrates between different stations attached to the mainframe as well as flipping the substrate being transferred to the desired surface orientation. For example, the flipper robot 244 flips the substrate processing surface face-down for the electroplating process in the processing cell 240 or polishing process in the polishing platens of the polishing station 215, and flips the substrate processing surface face-up for other processes, such as the spin-rinse-dry process or substrate transfer. The mainframe transfer robot 242 provides independent robot motion along the X-Y-Z axes by the robot arm 246 and independent substrate flipping rotation by the flipper robot end effector 244. The flipper robot 244 are used with electrochemical processing cells 240 adapted to electroplate a substrate disposed on a flipper or adapted to receive a substrate from a flipper robot prior to performing an electrochemical process.

Figure 1:
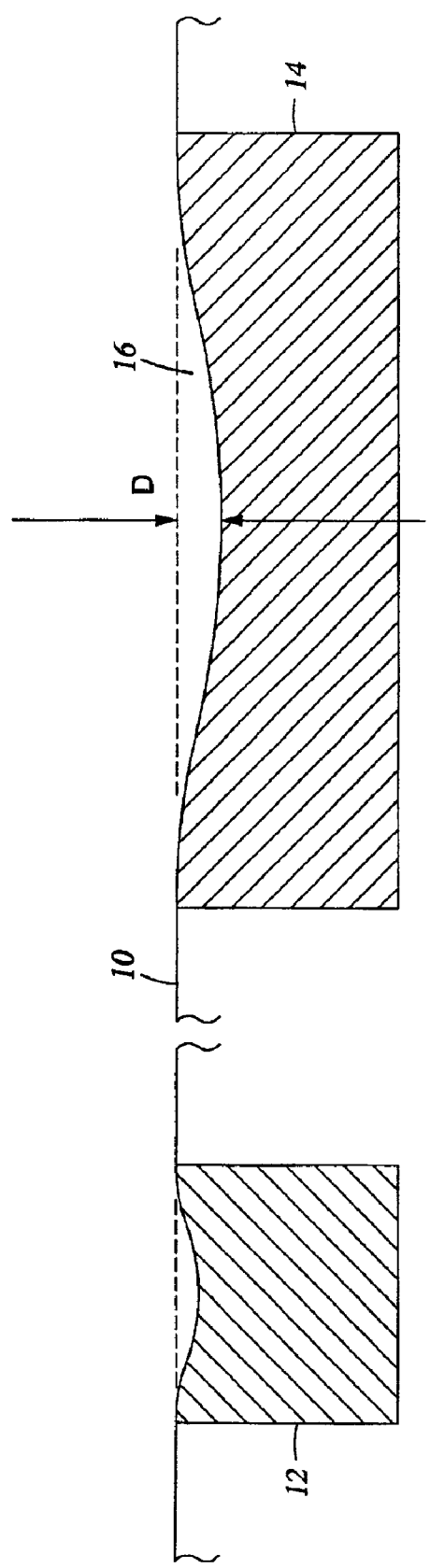
FIG. 1 is a schematic view of a substrate illustrating the phenomenon of dishing.

Alternatively, a substrate carrier (as shown in FIG. 1) may be disposed in place of the mainframe transfer robot 242 to transfer between and/or process substrates in the one or more electrochemical processing stations 218 and the one or more polishing stations 215.

The rapid thermal anneal (RTA) chamber 211 is preferably connected to the loading station 210, and substrates are transferred into and out of the RTA chamber 211 by the loading station transfer robot 228. The electroplating system may comprises two RTA chambers 211 disposed on opposing sides of the loading station 210, corresponding to the symmetric design of the loading station 210, in one embodiment. An example of a suitable anneal chamber is a rapid thermal anneal chamber, such as the RTP XEplus Centura® thermal processor available from Applied Materials, Inc., Santa Clara, Calif.

The electrolyte replenishing system 220 provides the electrolyte to the electroplating process cells 240 for the electroplating and/or anodic dissolution process. The electrolyte replenishing system 220 generally comprises a main electrolyte tank 260, a plurality of source tanks 262, and a plurality of filter tanks 264. One or more controllers control the composition of the electrolyte in the main tank 260 and the operation of the electrolyte replenishing system 220. Preferably, the controllers are independently operable but integrated with the control system 222 of the system 200.

The main electrolyte tank 260 provides a reservoir for electrolyte and includes an electrolyte supply line that is connected to each of the electroplating process cells. The source tanks 262 contain the chemicals needed for composing the electrolyte and typically include a deionized water source tank and copper sulfate ($CuSO_4$) source tank for composing the electrolyte. Other source tanks 262 may contain hydrogen sulfate ($H_2SO_4$), hydrogen chloride (HCl), hydrogen phosphate ($H_2PO_4$), and/or various additives including corrosion inhibitors and leveling agents, such as polyglycols.

Additionally, while not shown, one or more supply tanks are connected to system 200 to provide one or more polishing fluids, conditioning fluids, and/or cleaning fluids, to the one or more polishing stations 215 disposed thereon.

Figure 4:
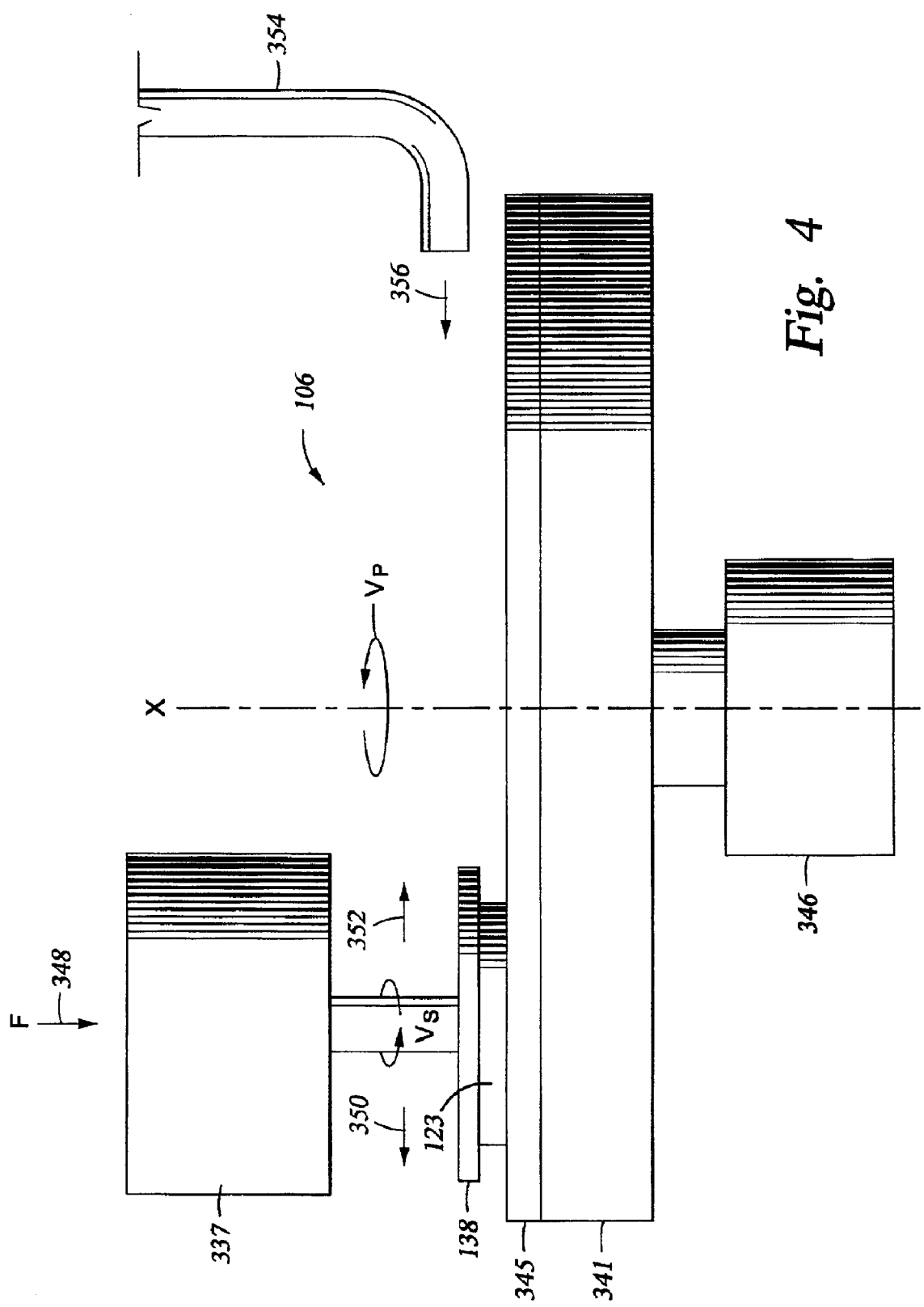
FIG. 4 is a schematic view of one embodiment of a polishing station that may conduct polishing with a conventional or abrasive sheet polishing pad.

FIG. 4 is a schematic view of one embodiment of a polishing station 106 and polishing head 138 as shown in FIG. 2 that may conduct polishing with a conventional or abrasive sheet polishing pad. The polishing station 106 comprises a polishing pad assembly 345 secured to an upper surface of a rotatable platen 341. The platen 341 is coupled to a motor 346 or other suitable drive mechanism to impart rotational movement to the platen 341. During operation, the platen 341 is rotated at a velocity $V_p$ about a center axis X. The platen 341 can be rotated in either a clockwise or counterclockwise direction.

FIG. 4 also shows the polishing head 138 mounted above the polishing station 106. The polishing head 138 supports a substrate 123 for polishing. The polishing head 138 may comprise a vacuum-type mechanism to chuck the substrate 123 against the polishing head 138. During operation, the vacuum chuck generates a negative vacuum force behind the surface of the substrate 123 to attract and hold the substrate 123. The polishing head 138 typically includes a pocket (not shown) in which the substrate 123 is supported, at least initially, under vacuum. Once the substrate 123 is secured in the pocket and positioned on the pad assembly 345, the vacuum can be removed. The polishing head 138 then applies a controlled pressure behind the substrate, indicated by the arrow 348, to the backside of the substrate 123 urging the substrate 123 against the pad assembly 345 to facilitate polishing of the substrate surface. The polishing head displacement mechanism 337 rotates the polishing head 138 and the substrate 123 at a velocity $V_s$ in a clockwise or counterclockwise direction, preferably the same direction as the platen 341. The polishing head displacement mechanism 337 also preferably moves the polishing head 138 radially or orbitally across the platen 341 in a direction indicated by arrows 350 and 352.

The CMP system also includes a chemical supply system 354 for introducing chemical slurry of a desired composition to the polishing pad. In some applications, the slurry provides an abrasive material that facilitates the polishing of the substrate surface, and may be a chemical mechanical polishing composition that may optionally include abrasive materials, such as solid alumina or silica. During operation, the chemical supply system 354 introduces the slurry, as indicated by arrow 356, on the pad assembly 345 at a selected rate. In other applications the pad assembly 345 may have abrasive particles disposed thereon and require only that a liquid, such as deionized water, be delivered to the polishing surface of the pad assembly 345.

The pad assembly 345 may comprise a conventional polishing pad or an abrasive sheet polishing pad. The abrasive sheet polishing pad includes a 5–200 mil thick abrasive composite layer, composed of abrasive grains held or embedded in a binder material. The abrasive grains may have a particle size between about 0.1 and 1500 microns, and have a Mohs' hardness of at least 8, such as silica, ceria, or alumina. The binder material may be derived from a precursor that includes an organic polymerizable resin, which is cured from the binder material, such as polyurethane. Abrasive sheet pads are available from 3M Corporation of Minneapolis, Minn. and Rodel Inc., of Phoenix Ariz.

The pad assembly 345 may include a conventional polishing pad or "abrasive-free" polishing pad, i.e., a polishing pad that does not have embedded abrasive particles, having a smooth polishing surface or a roughened polishing surface. A suitable soft polishing pad is available from Rodel, Inc., of Phoenix, Ariz., under the trade name Politex and IC-1000. The polishing pad may be embossed or stamped with a pattern to improve distribution of slurry across the face of the substrate.

Figure 5:
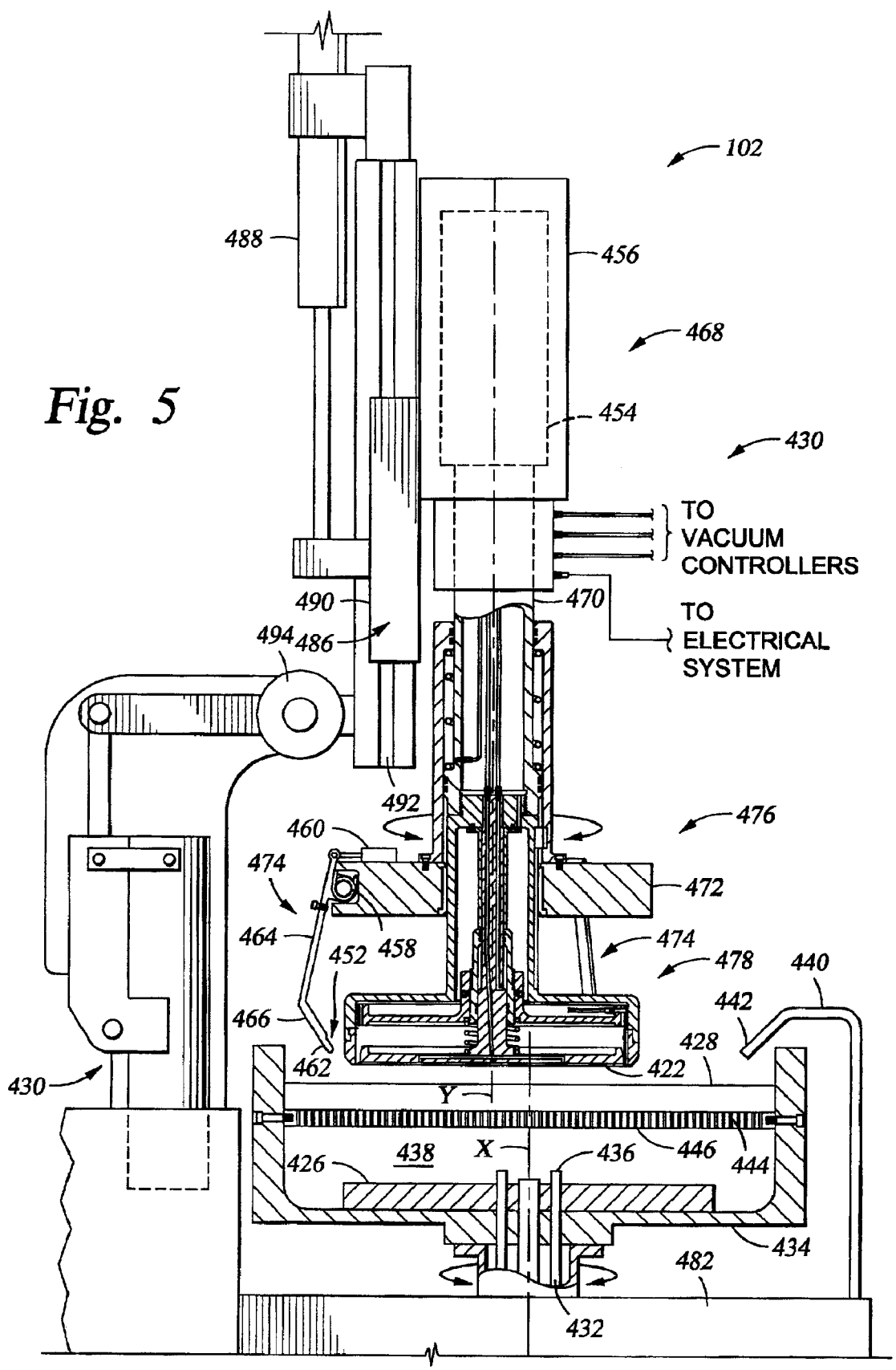
FIG. 5 is a cross sectional view of one embodiment of an apparatus that may deposit and polish a material by an electrochemical process.

FIG. 5 is a cross sectional view of one embodiment of a processing station 102 for performing an electrochemical deposition process. One example of an apparatus that may be adapted to benefit from the invention is the processing system described in FIGS. 2 and 3.

The processing station 102 generally includes a carrier head assembly 104 movably supported by a stanchion 480 over a partial enclosure 434. The stanchion 480 and enclosure 434 are generally disposed on a common base 482. The stanchion 480 generally includes a base support 484 and a lift mechanism 486. The base support 484 extends perpendicularly from the base 482 and may be rotatable on its axis so that the carrier assembly 104 may be moved over the partial enclosure 434 or to other positions, for example, to other enclosures or to interface with other processing systems not shown.

The lift mechanism 486 is coupled to the carrier assembly 104. The lift mechanism 486 generally controls the elevation of the carrier assembly 104 in relation to the partial enclosure 434. The lift mechanism 486 includes be a linear actuator 88, such as a ball screw, lead screw, pneumatic cylinder and the like, and a guide 490 that slides along a rail 492. The rail 492 is coupled to the base support 484 by a hinge 494 so that the rail 492 of the lift mechanism 486 (i.e., direction of motion) may be controllably orientated through a range of angles between about 90 to about 60 degrees relative to horizontal. The lift mechanism 486 and hinge 494 allows the carrier assembly 104 holding a substrate 123 to be lowered into the partial enclosure 434 in various orientations. For example, to minimize the formation of bubbles upon the substrate 123 when interfacing with fluids disposed within the enclosure 434, the substrate 123 may be orientated at an angle during entry into the partial enclosure 434 and then rotated to a horizontal orientation once therein.

The partial enclosure 434 generally defines a container or electrolyte cell in which an electrolyte or polishing/deposition fluid can be confined. The electrolyte used in processing the substrate 123 can include metals such as copper, aluminum, tungsten, gold, silver, platinum, nickel, tin, cobalt, doped versions thereof, and alloys thereof, or other materials which can be electrochemically deposited, such as by an electroplating deposition process, an electroless deposition process, or an electrochemical mechanical plating process technique (ECMPP), onto a substrate. An ECMPP process is broadly described herein as an electrochemical deposition technique that enhances planarization of materials during deposition using polishing techniques.

As one example, copper sulfate ($CuSO_4$) can be used as the electrolyte. Copper containing solutions used for plating are available from Shipley Rodel, a division of Rohm and Haas, headquartered in Philadelphia, Pa., under the tradename Ultrafill 2000. The invention also contemplates the use of any known or commercially available electroless and electroplating chemistries.

The enclosure 434 may includes an anode/cathode 426 for electroplating deposition processes, a diffuser plate 444, and a permeable disk 428, which may be used in a deposition and polishing technique, disposed therein.

The partial enclosure 434 can be a bowl shaped member made of a plastic such as fluoropolymers, TEFLON®, PFA, PE, PES, or other materials that are compatible with plating chemistries. The partial enclosure 434 is connected to a shaft 432 on its lower surface that extends below the base 482. Alternatively, the partial enclosure 434 can be connected to a mounting platform that is connected to the shaft 432. The shaft 432 is connected to an actuator (not shown), such as a motor, e.g., a stepper motor, disposed in the base 482. The actuator is adapted to rotate the partial enclosure 434 about vertical axis x. In one embodiment, the shaft 432 defines a central passage through which fluid is delivered into the partial enclosure 434 through a plurality of ports 36 formed in the shaft 432.

The anode/cathode 426 is positioned at the lower portion of the enclosure 434 where it may be immersed in the electrolyte solution. The anode/cathode may perform as either an anode or a cathode depending upon the positive bias (anode) or negative bias (cathode) applied to it. For example, depositing material from an electrolyte on the substrate surface, the anode/cathode 426 acts as an anode and the substrate surface acts as a cathode. When removing material from a substrate surface, such as by dissolution from an applied bias, the anode/cathode 426 functions as a cathode and the wafer surface or permeable disk 428 may act as an anode for the dissolution process.

The anode/cathode 426 can be a plate-like member, a plate having multiple holes formed therethrough or a plurality of pieces disposed in a permeable membrane or container. The anode/cathode 426 may be comprised of the material to be deposited. In at least one embodiment, the anode/cathode 426 comprises a consumable anode/cathode that may require periodic replacement. Alternatively, the anode/cathode may comprise non-consumable anode/cathode of a material other than the deposited material, such as platinum for a copper deposition or removal.

In at least one embodiment, the anode/cathode 426 is ring-shaped defining a central opening through which the fluid inlet of the shaft 432 is disposed. In embodiments where the anode/cathode 426 is plate-like, a plurality of holes may be formed through the anode/cathode to allow passage of electrolyte fluid therethrough. The anode/cathode 426 can alternatively be a ring anode/cathode, a plate anode/cathode, or a chamber confining plating material, including a permeable chamber or other enclosure.

The permeable disk 428 can be a polishing pad or other type of volume spacer that is compatible with the fluid environment and the processing specifications. When incorporated with the station 104, the permeable disk 428 is positioned at an upper end of the partial enclosure 434 and supported on its lower surface by the diffuser plate 444. The permeable disk 428 is preferably conductive to ions in the electrolyte, and as such does not have to be permeable to metal ions, such as copper ions, for example, in copper applications. The metal ions can be supplied from a fluid delivery line 440 having an outlet 442 positioned above the permeable disk 428. The permeable disk 428 may disposed adjacent to or in contact with the anode/cathode 426.

The permeable disk 428 may comprise a plurality of pores of a sufficient size and organization to allow the flow of electrolyte to the substrate surface while preventing the flow of deposition by-products, such as accelerator and suppressor degradation by-products. The permeable disk 428 may also comprise grooves formed therein to assist transport of fresh electrolyte from the solution into enclosure 434 to the gap between the substrate 422 and the permeable disk 428. However, the permeable disk 428 can be permeable to metal ions in some applications.

The permeable disk 428 includes polishing media, such as a polishing pad comprised of polymeric materials, such as polyurethane, for performing electrochemical mechanical polishing processes during or subsequent to deposition processes. Examples of polishing pads that can be used include, but are not limited to, an IC 1000, an IC 1010, a Suba series pad, a Politex series pad, a MHS series pad from Rodel, Inc., of Phoenix, Ariz., or a PVDF pad from Asahi of Japan, or a abrasive sheet pad from 3 M, of Minneapolis, Minn.

The permeable disk may be polishing media including conductive material for electroplating deposition process. For an electroplating deposition, the conductive polishing media may comprise a conductive polymer, or a polymer, such as polyurethane, with conductive elements or materials (not shown) embedded or formed therein, to provide a conductive path over the polishing media. The conductive elements are electrically connected to one another in the polishing media and may contact the substrate surface when the substrate is in contact with the polishing media. Alternatively the polishing media may form an insulator material, or a material of low conductance, such as polyurethane for a deposition process.

The diffuser plate 444 provides support for the permeable disk 428 in the partial enclosure 434. The diffuser plate 444 can be secured in the partial enclosure 434 using fasteners such as screws 438 or other means such as snap or interference fit with the enclosure, being suspended therein and the like. The diffuser plate 444 can be made of a material such as a plastic, e.g., fluoropolymer, PE, TEFLON®, PFA, PES, HDPE, UHMW or the like. The diffuser plate 444, in at least one embodiment, includes a plurality of holes or channels 446 formed therein. The holes 446 are sized to enable fluid flow therethrough and to provide uniform distribution of electrolyte through the permeable disk 428 to the substrate 123.

The permeable disk 428 can be fastened to the diffuser plate 444 using adhesives that are compatible with the fluid environment and the processing requirements. The diffuser plate 444 is preferably spaced from the anode/cathode 426 to provide a wider process window, thus reducing the sensitivity of plating film thickness to the anode/cathode dimensions, and to separate the accelerator and suppressor decomposition by-products, for example, a mono-sulfide compound degraded from an accelerator, such as bis(3-sulfopropyl) disulfide, $C_6H_{12}Na_2O_6S_4$, commercially available from the Raschig Corp. of Germany, from a main plating volume 438 defined between the permeable disk 428 and the substrate 123.

While not shown, a membrane may be disposed between the anode/cathode 426 and the permeable disk 428 to contain particles produced from the anode/cathode film from entering the enclosure 434 and depositing as particles on the substrate surface. For example, the membrane is permeable to electrolyte flow, but is not typically permeable to accelerator and suppressor degradation by-products on the anode/cathode surface.

The substrate carrier or head assembly 104 is movably positioned above the permeable disk 428. The substrate carrier assembly 104 is vertically movable above the permeable disk 428 and is laterally movable thereto, for example, the carrier assembly 104 may be rotatable about a vertical axis y. The x and y axis of the partial enclosure and the head assembly, respectively, are offset to provide orbital motion between the permeable disk 428 and the substrate carrier assembly 104. Orbital motion is broadly described herein as an elliptical relative motion between the permeable disk 428 and the substrate carrier assembly 104. The substrate carrier assembly 104 holds a substrate 123 with the deposition surface facing down towards the permeable disk 428. Alternatively, the permeable disk 428 may comprise a surface which may move in a translational or linear relative motion as well as rotatable, or circular rotational, relative motion to the substrate carrier assembly 104.

The substrate carrier assembly 104 generally includes a drive system 468, a head assembly 478 and a seat assembly 476. The drive system 468 is generally coupled to the guide 490 of the stanchion 480. The drive system 468 comprises a column 470 that extends from a power head 456 to support the seat assembly 476. The power head 456, which may be an electric or pneumatic motor, generally provides rotation to the column 470 along a central axis. The drive system 486 additionally includes an actuator 454 that is disposed within the column 470 and is coupled to the head assembly 478. The actuator 454, which may be a lead screw, pneumatic cylinder or other linear actuator, allows the head assembly 478 to move in relation to the seat assembly 476.

The seat assembly 476 generally includes a plurality of gripper fingers 474 disposed in a polar array about a gripper plate 472. The gripper plate 472 is coupled to the column 70 so that the gripper plate 472 moves with the drive system 468. In one embodiment, three gripper fingers 474 are provided. The gripper fingers 474 generally include a base member 466, an extension 464 and a contact finger 462. The contact fingers 462 are disposed at an angle to the extension 464. The extension 464 is coupled to the base member 466. The base member 466 is rotatably coupled to the gripper plate 472. The base member 466 generally includes an aperture that aligns with a hole in the gripper plate 472. A clevis pin or other shaft member is disposed through the hole and aperture to allow rotation of the gripper finger 474 in relation to the gripper plate 472. An actuator 460 is coupled between the extension 464 and the gripper plate 472. The actuator 460 moves the gripper finger 474 between an open and closed position. A spring 458 may be optionally disposed on the clevis pin to bias the gripper finger 474 towards one position. When the contact fingers 462 are moved inward, a notch 452 disposed at the ends of each contact finger 462 defines a seat 450 that is adapted to receive the substrate 123 from a transfer robot (not shown). In the inward position, the extensions 464 are disposed at a distance from each other that allows the substrate 422 and robot to pass therebetween (not shown).

Figure 6A:
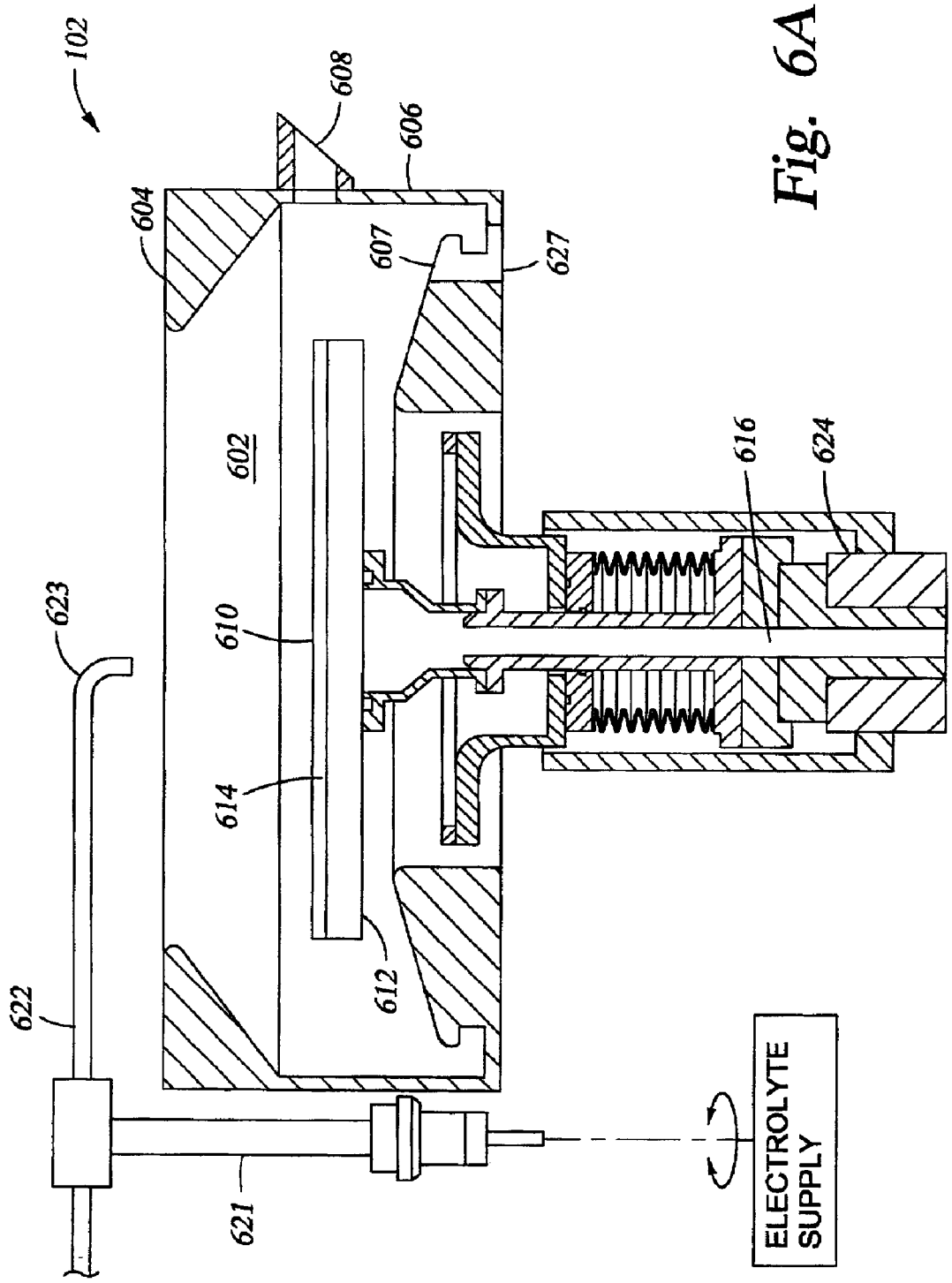
FIGS. 6A–6C are cross sectional views of further embodiments of an apparatus that may deposit and polish a material by an electrochemical process.
Figure 6B:
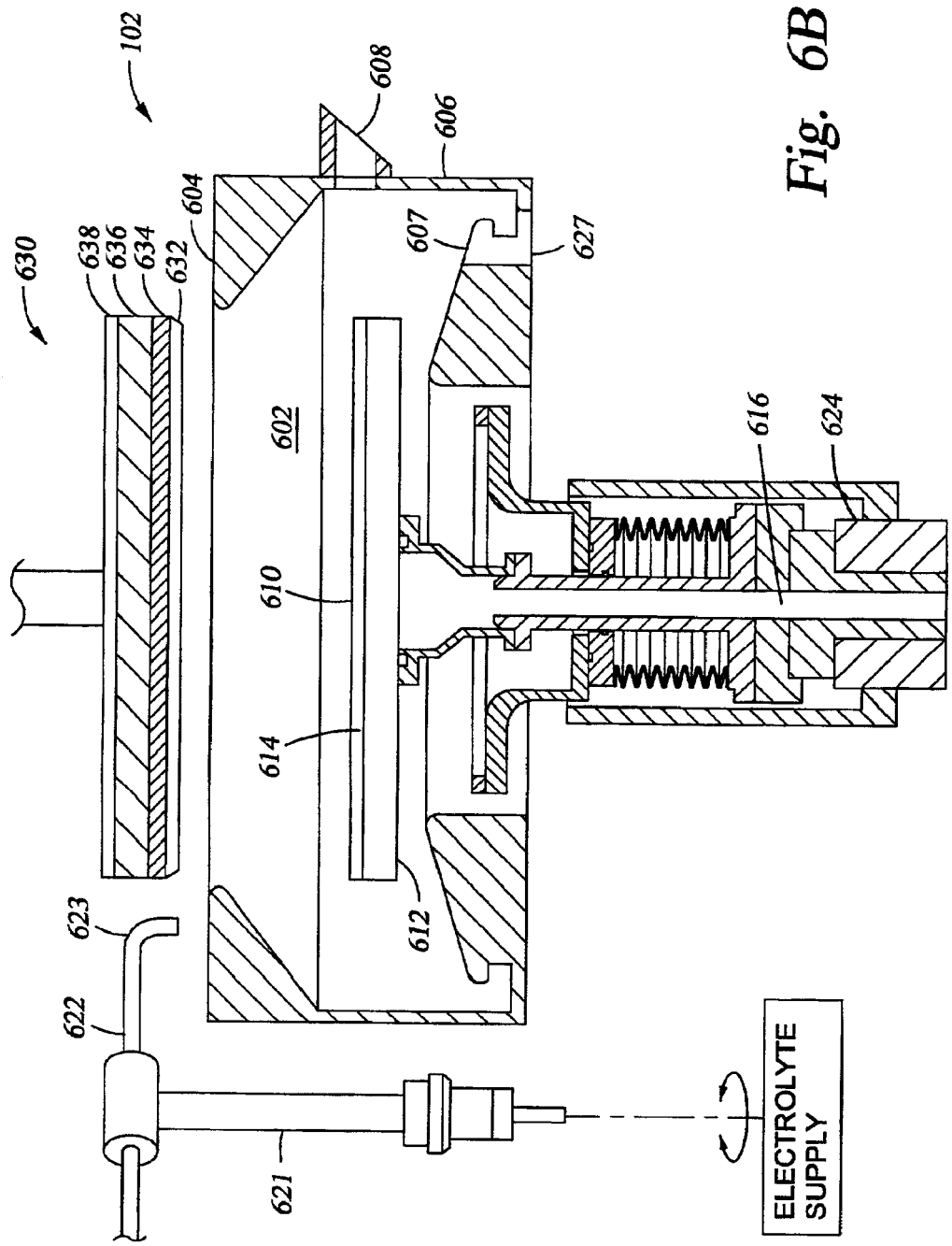
Figure 6C:
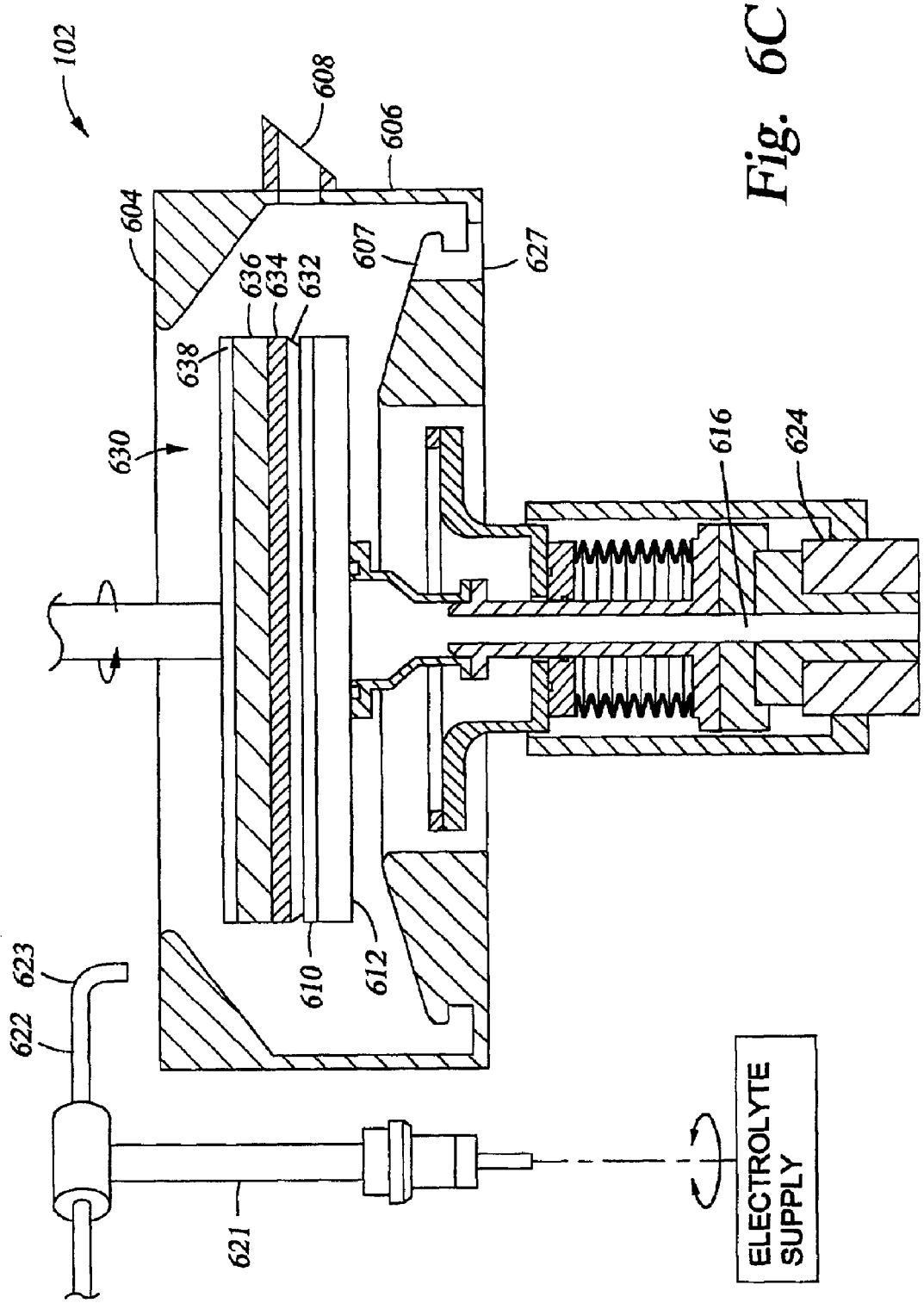

FIGS. 6A–6C show schematic cross-sectional views of other embodiments of a processing station 602 useful for the deposition and removal of a conductive material layer as described herein. For example, the processing station 602 may be disposed at station 102 as shown in FIG. 2 or at stations 215 or 218 in FIG. 3. The processing station on FIG. 6A may be used for electroless deposition of a conductive material on a substrate surface. The station 602 includes a processing compartment 602 comprising a top 604, sidewalls 606, and a bottom 607. A substrate support 612 is disposed in a generally central location in the station 602.

The substrate support 612 includes a substrate receiving surface 614 to receive the substrate 610 in a "face-up" position. In one aspect, having the substrate 610 disposed on the substrate support 612 in a "face-up" position reduces the possibility of bubbles in a fluid when applied to the substrate 610 from affecting the processing of the substrate 610. For example, bubbles may be created in the fluid in-situ or may be created by transferring of a wet substrate. If the substrate were disposed in a "face-down position" during processing, bubbles in the fluid would be trapped against the surface of the substrate as a result of the buoyancy of the bubbles. Having the substrate in a "face-up" position reduces bubbles in the fluid from being situated against the surface of the substrate since buoyant forces pressure the bubbles to rise up in the fluid. Having the substrate in a face-up position also lessens the complexity of the substrate transfer mechanisms, improves the ability to clean the substrate during processing, and allows the substrate to be transferred in a wet state to minimize contamination and/or oxidation of the substrate.

The station 602 further includes a slot 608 or opening formed through a wall thereof to provide access for a robot (not shown) to deliver and retrieve the substrate 610 to and from the station 602. A lift assembly 616 may be disposed below the substrate support 612 to raise and lower the substrate support 612 or raise and lower the substrate 610 to and from the substrate receiving surface 614 of the substrate support 612. A motor 624 may be coupled to the substrate support 612 to rotate the substrate support 612 to spin the substrate 610. The substrate support may be adapted to rotate the substrate in a clockwise direction or counterclockwise direction.

The substrate support 612 may be heated to heat the substrate 610 to a desired temperature. The substrate receiving surface 614 of the substrate support 612 may be sized to substantially receive the backside of the substrate 610 to provide uniform heating of the substrate 610. Uniform heating of a substrate is an important factor in order to produce consistent processing of substrates, especially for deposition processes having deposition rates that are a function of temperature. The substrate support 612 may further be coupled to a power source (not shown) typically a DC power source to bias the substrate support 612.

A nozzle 623 may be disposed in the station 602 to deliver a fluid, such as a chemical processing solution, deionized water, and/or an acid solution, to the surface of the substrate 610. The nozzle 623 may be disposed over the center of the substrate 610 to deliver a fluid to the center of the substrate 610 or may be disposed in any position. The nozzle 623 may be disposed on a dispense arm 622 positioned over the top 604 or through the sidewall 616 of the processing compartment 602. The dispense arm 622 may be moved about a rotatable support member 621 which is adapted to pivot and swivel the dispense arm 622 and the nozzle 623 to and from the center of the substrate 610. Additionally or alternatively, a nozzle (not shown) may be disposed on the top 604 or sidewalls 606 of the station 602 and adapted to spray a fluid in any desired pattern to the substrate 610. A single or a plurality of fluid sources (not shown) may be coupled to the nozzle 623 to provide a plurality of different types of fluids.

Alternatively, the components of the processing compartment 602 may be hermetically sealed to provide for filing the processing compartment with an electrolyte prior to substrate transfer and processing.

In one embodiment, the substrate support 612 may be adapted to rotate at relatively slow speeds, such as between about 10 RPMs and about 500 RPMs, depending on the viscosity of the fluid, to spread the fluid across the surface of the substrate 610 by centrifugal force. The substrate support 612 may be adapted to spin in alternating directions in a back-and-forth motion to assist in spreading the fluid evenly across the surface of the substrate 610. In one embodiment, the dispense arm 622 is adapted to move during dispense of the fluid to improve fluid coverage of the substrate 610.

The substrate support 612 may rotate during dispensing of a fluid from the nozzle 623 in order to increase throughput of the system. In some instances, the substrate support 612 may be adapted to spin at relatively medium speeds, such as between about 100 RPMs and about 500 RPMs, to rinse the substrate 610 with a fluid. In other instances, the substrate support may be adapted to spin at relatively fast speeds, such as between about 500 RPMS and about 2000 RPMs to spin dry the substrate 610.

The station 602 further includes a drain 627 in order to collect and expel fluids used in the station 602. The bottom 607 of the processing compartment 602 may comprise a sloped surface to aid the flow of fluids used in the chamber 610 towards the drain 627 and to protect the substrate support assembly 613 from contact with fluids.

The substrate support 612 may include a vacuum port (not shown) coupled to a vacuum source (not shown) to supply a vacuum to the backside of the substrate to vacuum chuck the substrate 610 to the substrate support 612. Vacuum Grooves may be formed on the substrate support 612 in communication with the vacuum port to provide a more uniform vacuum pressure across the backside of the substrate 610. In one aspect, the vacuum chuck improves heat transfer between the substrate 610 and the substrate support 612. In addition, the vacuum chuck holds the substrate 610 during rotation of the substrate support 612. While not shown, a heater may be disposed in the substrate support 612 for heating the substrate suring processing.

FIGS. 6B and 6C show a processing station 602 that may be used for electroless deposition and polishing of a conductive material and/or barrier layer materials on a substrate surface. A polishing head assembly 630 is used to contact a substrate surface and remove materials therefrom. The polishing head assembly includes polishing media 632, polishing media support 634, optionally, a spacer 636, and, further optionally, an electrode 638.

The polishing media 632 may be a conventional polishing media, such as polyurethane or polyurethane composites, including the IC-1000 polishing pad, from Rodel Inc., of Phoenix, Ariz. The polishing media 632 may also include a conductive polishing material or a composite of a conductive polishing material disposed in a conventional polishing material. The conductive polishing material may include conductive polymers, polymer composites with conductive materials, conductive metals, conductive fillers or conductive doping materials, or combinations thereof.

Generally, the conductive polishing material or the composite of the conductive polishing material and conventional polishing material are provided to produce a conductive polishing media having a bulk resistivity or a bulk surface resistivity of about 10 $\Omega D$ -cm or less. An example of a composite of the conductive polishing material and conventional polishing material includes carbon fibers or carbon nanotubes, both of which exhibit resistivities of 1 $\Omega$-cm or less, disposed in a conventional polishing material of polycarbonate or polyurethane in sufficient amounts to provide a polishing media having a bulk resistivity of about 10 $\Omega$-cm or less. The conductive polishing media 632 is generally perforated to allow for electrolyte flow therethrough.

Alternatively, the polishing media 632 may comprise a metal mesh disposed in the conventional polishing material. The metal mesh may comprise a chemically inert conductive material, such as platinum, which has a resistivity 9.81 $\Omega$-cm at 0° C. The metal mesh may also include materials that have been observed to react with the surrounding electrolyte, such as copper which has a resistivity of 1.6 $\Omega$-cm at 0° C., if the metal mesh is chemically insulated from the electrolyte such as by a conformal layer of conventional material.

The polishing media support 634 can be made of materials which include conductive noble metals, such as platinum, or a conductive polymer to provide electrical conduction across the polishing media. The polishing media support 634 is used to provide for uniform bias or current to minimize conductive resistance along the surface of the media, for example, the radius of the media, during polishing for uniform anodic dissolution across the substrate surface. The polishing media support 634 is generally connected to a power source (not shown) and provides the current carrying capability, i.e., the anodic bias for anodic dissolution, of the conductive polishing media 632. The polishing media support may also be perforated for flow of electrolyte therethrough. The polishing media 632 and polishing media support 634 generally form a first electrode for performing either a plating process or an electropolish process to deposit or remove material, respectively, from the substrate surface.

The spacer 636 generally comprises a rigid support material used to hold the polishing media 632 and the polishing media support 634. The spacer 636 may include a conductive material or an insulative material. The spacer 636 may include polymeric material, for example fluoropolymers, PE, TEFLON®, PFA, PES, HDPE, UHMW or the like, and may include a conventional hard polishing material, for example, materials found in the IC series of polishing media, such as polyurethane or polyurethane composites, including the IC-1000 polishing pad, from Rodel Inc., of Phoenix, Ariz.

The electrode 638 may be an anode or cathode depending upon the positive bias (anode) or negative bias (cathode) applied between the electrode 204 and polishing media 632. For example, depositing material from an electrolyte on the substrate surface, the electrode 638 acts as an anode and the substrate surface and/or polishing media 632 acts as a cathode. When removing material from a substrate surface, such as by dissolution from an applied bias, the electrode 638 functions as a cathode and the substrate surface and/or polishing media 632 may act as an anode for the dissolution process.

The electrode 638 can be a plate-like member, a plate having multiple holes formed therethrough or a plurality of electrode pieces disposed in a permeable membrane or container, and is generally contacting or immersed in the electrolyte. The electrode 638 may be comprised of the material to be deposited or removed, such as copper, aluminum, gold, silver, tungsten and other materials which can be electrochemically deposited on the substrate.

However, for electrochemical removal processes, such as anodic dissolution, the electrode 638 may include a non-consumable electrode of a material other than the deposited material, such as platinum for copper dissolution. The non-consumable electrode is used in planarization processes combining both electrochemical deposition and removal.

The polishing head assembly may be rotated at a rate between about 10 rpms and about 200 rpms during polishing. The polishing head may be rotated in a clockwise direction or a counter-clockwise direction. The polishing head may be adapted to rotate in the same or opposite direction as the substrate support 612.

The polishing head assembly may have a smaller diameter than the substrate. The polishing head assembly may be moved over the substrate surface during the polishing process to polish selected portions of the substrate surface at selected intervals to provide for effective planarization of the substrate surface. The polishing head assembly may be controlled to polish the substrate surface in a predetermined or random pattern. The polishing head assembly may be further controlled to polish selected portions of the substrate surface for selective periods of time. For example, the substrate may be polished in an elliptical pattern, or the edges of the substrate may be polished more than the center of the substrate, or only a selected portion, Le., the center of the substrate, is polished. The above polishing examples are provided to illustrate aspects described herein, and are not to be construed or interpreted as limiting the scope of the invention.

Chemical Mechanical Polishing Process and Composition

The words and phrases used herein should be given their ordinary and customary meaning in the art by one skilled in the art unless otherwise further defined. Chemical-mechanical polishing should be broadly construed and includes, but is not limited to, abrading a substrate surface by chemical activity, mechanical activity, or a combination of both chemical and mechanical activity. Electropolishing should be broadly construed and includes, but is not limited to, planarizing a substrate by the application of electrochemical activity.

Electrochemical mechanical polishing (ECMP) should be broadly construed and includes, but is not limited to, planarizing a substrate by the application of electrochemical activity, mechanical activity, or a combination of both electrochemical and mechanical activity to remove material from a substrate surface. Electrochemical mechanical plating process (ECMPP) should be broadly construed and includes, but is not limited to, electrochemically depositing material on a substrate and concurrently planarizing the deposited material by the application of electrochemical activity and mechanical activity.

Electrochemical deposition processes are broadly described herein by the deposition of material by an electron exchange mechanism, such as by a chemical reduction method. Electroplating is broadly defined herein as the deposition of a conductive material generally provided as charged ions in a bath by the application of an external electrical current to reduce the ions and deposit material. Electroless deposition is broadly defined herein as deposition of a conductive material generally provided as charged ions in a bath over a catalytically active surface to deposit the conductive material by chemical reduction in the absence of an external electric current.

A substrate surface processed by the methods and compositions described herein generally comprises a dielectric layer with feature definitions formed therein, a barrier layer deposited on the dielectric layer, and a conductive material, for example, copper containing material, deposited on the barrier layer. Other conductive materials for filling feature definitions formed in the dielectric layer include aluminum, tungsten, and combinations thereof. The conductive material may be deposited by chemical vapor deposition, physical vapor deposition, electroless deposition, electroplating, or combinations thereof.

As used throughout this disclosure, material designations, such as the phrase "copper containing material", "copper", and the symbol Cu, are intended to encompass elemental materials, such as elemental copper, doped elemental materials, such as doped copper, e.g., phosphorous doped copper, and element based alloys, such as copper-based alloys, e.g., copper-based alloys containing at least about 80 wt. % copper. For example, the material designation of "cobalt" is intended to encompass elemental cobalt, cobalt alloys, and doped cobalt, such as cobalt phosphate.

The barrier layer material includes tantalum-containing materials, such as tantalum, tantalum nitride, or tantalum silicon nitride. Other barrier materials for conductive materials used in aluminum, copper, and tungsten metallization processes include titanium, titanium nitride, tungsten, tungsten nitride, PVD titanium stuffed with nitrogen, doped silicon, aluminum, aluminum oxides, titanium silicon nitride, tantalum silicon nitride, tungsten silicon nitride, and combinations thereof. The barrier layer materials may be deposited by chemical vapor deposition, physical vapor deposition, electroless deposition, electroplating, or combinations thereof.

The dielectric layer can comprise any of various dielectric materials conventionally employed in the manufacture of semiconductor devices. For example, dielectric materials, such as silicon dioxide, phosphorus-doped silicon glass (PSG), boron-phosphorus-doped silicon glass (BPSG), and silicon dioxide derived from tetraethyl orthosilicate (TEOS) or silane by plasma enhanced chemical vapor deposition (PECVD) can be employed. The dielectric layer can also comprise low dielectric constant materials, including fluoro-silicon glass (FSG), polymers, such as polyamides, and carbon-containing silicon dioxide, such as Black Diamond™, commercially available from Applied Materials, Inc., of Santa Clara, Calif. Generally, the dielectric layer is formed by a chemical vapor deposition technique or a spin-on glass techniques. The openings are formed in interlayer dielectrics by conventional photolithographic and etching techniques.

One planarizing process for reducing or minimizing dishing or recesses formed in a substrate surface generally includes polishing a first conductive material from the substrate surface to a barrier layer, depositing a second conductive material on the first conductive material by an electrochemical deposition technique, and polishing the substrate to the dielectric layer.

Figure 7:
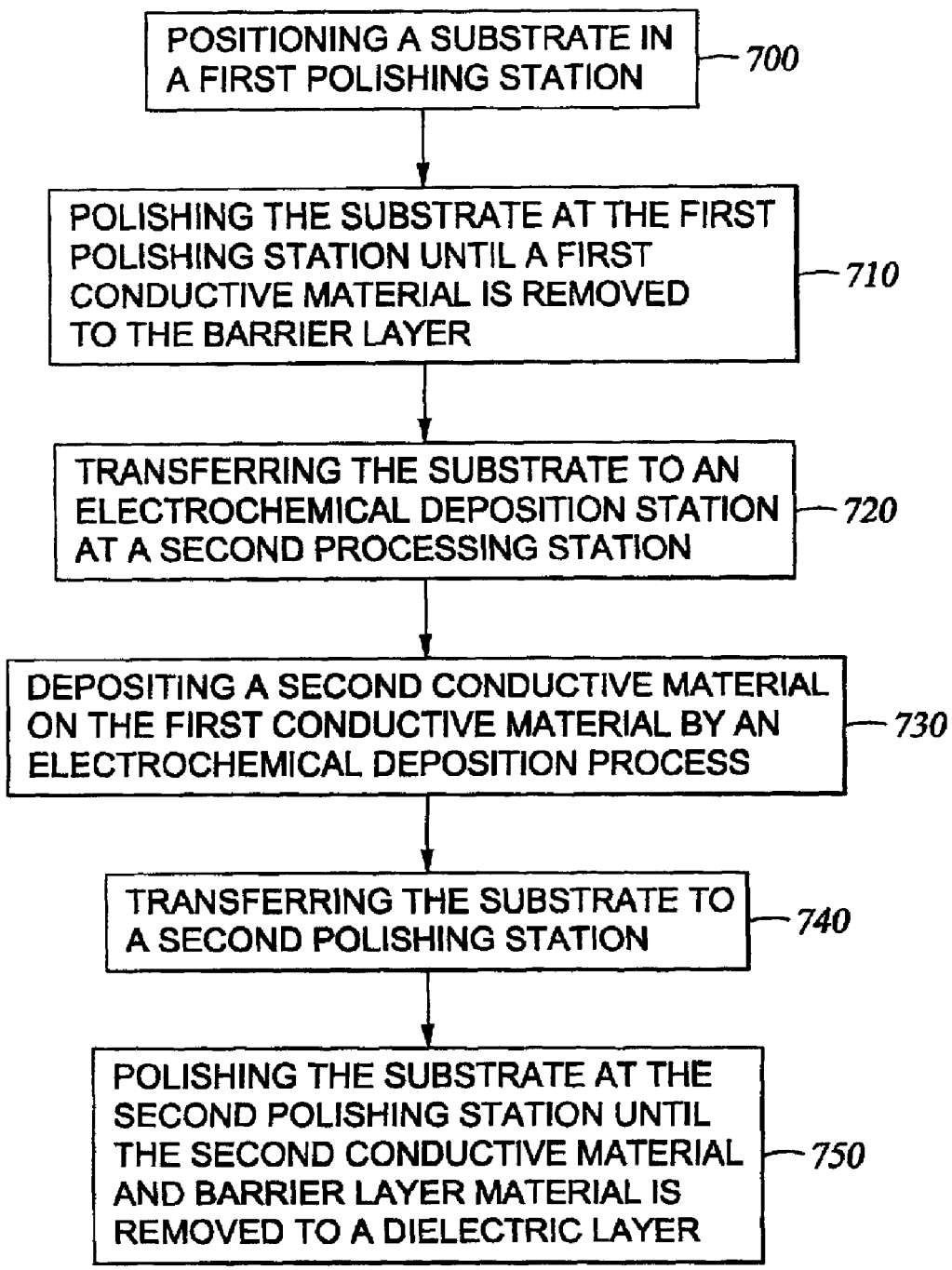
FIG. 7 is a flow chart illustrating the processing steps according to one aspect of the invention.

FIG. 7 is a flow chart illustrating the processing steps for planarizing a substrate surface according to one embodiment of the invention. The process generally includes positioning a substrate in a first polishing station at step 700, polishing the substrate at the polishing station until a first conductive material is removed to the barrier layer at step 710, transferring the substrate to an electrochemical deposition station at a second processing station at step 720, depositing a second conductive material on the first conductive material by an electrochemical deposition process at step 730, transferring the substrate to a second polishing station at step 740, and polishing the substrate at the second polishing station until the second conductive material and the barrier layer material is removed to a dielectric layer at step 750.

In one aspect, the planarizing process begins by providing a substrate to a processing system, for example, positioning a substrate in a substrate carrier assembly 138, and then positioning the substrate in the polishing station 106 at step 700. The substrate typically includes a dielectric layer with feature definitions formed therein, a barrier layer conformally deposited on the dielectric layer and in the feature definitions formed therein, and a first conductive material deposited on the barrier layer and filling the feature definitions formed therein as described above.

Polishing the substrate at the polishing station to remove at least a portion of the conductive material is performed in step 710. In one aspect of this polishing step, the conductive material is removed to the level of the barrier layer. The level of the barrier layer includes the top surface of the barrier layer or may include some intermediate level between the top surface of the barrier layer and the bottom surface of the barrier layer.

The conductive material may be removed by a polishing composition on a conventional or abrasive sheet polishing pad. The polishing composition used with the conventional polishing pad may be an abrasive-containing polishing composition or an abrasive-free polishing composition. Abrasive-containing compositions generally include abrasive particles, such as silica, alumina, or ceria disposed in the solution while abrasive-free composition polish the substrate in the absence of abrasive particles in the solution. Abrasive-free solutions are typically used with an abrasive sheet polishing pad having a plurality of elements comprising abrasive particles in a resin binder disposed on a flexible backing. For example, copper containing material can be removed using an abrasive-free polishing composition capable of removing copper containing material with minimal removal of a tantalum barrier material on a abrasive sheet pad.

Suitable polishing compositions for removing the conductive material, such as copper containing material, in the first polishing step include HC 430-A1–3, HS-C430-A3, HS-C435, HS-A2, commercially available from Hitachi Chemical Co. Ltd., of Japan. Examples of other suitable polishing compositions, including abrasive-containing polishing compositions and abrasive-free polishing compositions, commercially available for removing copper containing material in the first polishing step on a hard pad include EPC-5003, EPC-5001, and EPC-5306, available from Cabot Corp. of Aurora, Ill., Copper S1 3116, Copper S1 3280, and Copper S1 3125, available from Rodel Inc., of Newark, Del., Microplanar CMP9000, CMP9003, and CMP9011, available from EKC Technology Inc., of Hayward Calif., Eterpol EPL 2352, EPL 2311, EPL 1405, EPL 1453, EPL 2315, EPL 2313, and Eterpol 765057, available from Eternal Chemical Company Ltd. Of Taiwan, DP191 and DP-200, available from Dupont Chemical of Wilmington, Del.

Following the first polishing step 710, the substrate is transferred to a substrate carrier assembly 104, and positioned in the electrochemical deposition station 102 at a second processing station at Step 720 as shown in FIG. 7. The substrate is positioned in the partial enclosure 34 containing an electrolyte, and optionally, an anode. The substrate may be electrically connected to a power source (not shown) and function as a cathode during the electrochemical deposition process. At least the surface of the substrate is in contact with an electrolyte solution, and the entire substrate may be submerged in the electrolyte solution. The electrolyte solution is provided to the partial enclosure 34 through the fluid delivery line 40 and/or through the fluid inlet below the permeable disk 28.

The electrolyte disposed in the partial enclosure 34 may include any commercially available electrolytes for electroplating deposition techniques, electroless deposition techniques and ECMPP techniques. For example, the electrolyte may include any sulfuric acid based electrolytes, such as copper sulfate, for depositing conductive materials, or phosphoric acid based electrolytes, such as potassium phosphate $K_3PO_4$, that may be used for copper dissolution. The composition of the bath may vary based upon the material used in the manufacturing of the substrate features and the material to be deposited by the electrochemical deposition process.

Polishing of the substrate surface at step 710 can lead to the formation of topographical defects, such as recesses, in the substrate surface. A patching material, generally a second conductive material, is deposited on the conductive material initially deposited on the substrate, referred to herein as the first conductive material. The second conductive material is generally deposited on the first conductive material of the substrate in the electrochemical deposition system at step 730. Materials that are barrier materials to the first conductive material or passivate, e.g., prevent further chemical activity, such as oxidation, with the first conductive material may be used in filling the recesses. For example, materials, such as platinum, cobalt and tin, which are barrier materials to copper and passivate copper, e.g., prevent copper oxidation, are preferably used in filling recesses formed in copper features.

Examples of suitable second conductive materials include noble metal ions, semi-noble metal ions, Group IVA metal ions, and combinations thereof. Examples of noble metals include gold, silver, platinum, palladium, iridium, rhenium, ruthenium, and osmium, of which palladium or platinum are preferred. Examples of semi-noble metals include manganese, iron, cobalt, nickel, copper, lead, rhodium, carbon, aluminum, and tungsten, of which cobalt, nickel, or tungsten are preferred. Examples of Group IV metals include tin, titanium, and germanium, of which tin is preferred. Additionally, binary alloys, such as cobalt-tungsten, platinum-tin, palladium-tin, and ternary alloys, such as cobalt tungsten phosphate (CoWP), may also be used as the second conductive material.

The second conductive material is deposited to a thickness sufficient to fill any recesses formed by dishing. Deposition of excess second conductive material may be used to ensure fill of recesses and other topographical defects in the substrate surface. The second conductive material may be deposited to a thickness of between about 20 Å and about 2000 Å on the substrate surface. Excess second conductive material may also be used to ensure planarization during subsequent polishing processes, such as the barrier layer removal process, which may polish different materials, such as copper containing materials and tantalum containing materials at different rates and potentially result in dishing of the substrate surface.

Selective deposition of the second conductive material on the first conductive material may be achieved by taking advantage of the phenomenon in electrochemical deposition processes that some conductive materials, such as copper, have a greater degree of conductivity over a barrier layer materials, such as tantalum, and greater deposition of second conductive material will occur on the first conductive material rather than the barrier layer material. For example, an electrolyte and deposition process could be provided to have a deposition rate of 1200 Å on a copper-containing material in comparison to an deposition rate of 200 Å or less on tantalum, thereby allowing fill of topographical defects while minimizing material disposed on the barrier layer. Minimizing of material deposited on the barrier layers reduces material residues on the substrate surface that may detrimentally affect subsequent barrier polishing processes.

One such process is self-aligned barrier passivation, which includes selective deposition of the second conductive material on the first conductive material with reduced or minimal deposition on exposed portions of the barrier layer, with the second conductive material functioning as a barrier layer for the first conductive material. Self aligned barrier passivation may deposit the second conductive material on the first conductive metal by an electroless deposition process or an electroplating process.

The electroless deposition process involves an autocatalyzed chemical deposition process and typically involves exposing a substrate to a solution of the metal to be deposited by immersing the substrate in a bath or by spraying the solution over the substrate. The noble metal, semi-noble metal, and the Group IV metals described herein as the second conductive material may be added to the electroless deposition solution as an inorganic and/or organic salt. Examples of salts that may be used include chlorides, bromides, fluorides, fluoborates, iodides, nitrates, and sulfates. Metal chloride salts, such as palladium chloride ($PdCl_2$), chloroplatinic acid ($H_2PtCl_6$), and stannous chloride ($SnCl_2$), have been observed as effective in depositing platinum, tin, and platinum-tin alloys.

The electroplating process includes the application of a bias between the anode and the cathode disposed in the electroplating solution, or electrolyte, for deposition of the second conductive material on the first conductive material. Electroplating solutions typically include metal ions of the metal desired to be plated as a metal salt, such as a metal sulfate, a metal chloride, and combinations thereof. Typically, the electroplating solution also comprises acids, salts, other electrolytes, and other additives.

The bias may be applied at a voltage of about 15 volts or less to the substrate surface. A voltage between about 0.1 volts and about 15 volts may be used to dissolve copper from the substrate surface and into the electrolyte. The voltage applied to the substrate may vary depending upon the substrate surfaces and features in which copper-containing material is to be removed. The application of the bias may vary during the process dependent upon the processing condition and results desired. The invention contemplates the use of known electroplating processes and electroplating process to be developed for depositing the second conductive material.

One embodiment of an apparatus capable of depositing a nucleation layer by an electroplating process is an Electra CU™ ECP platform, available from Applied Materials, Inc. of Santa Clara, Calif., of which one embodiment is described herein. The electroplating apparatus is more fully described in U.S. patent application Ser. No. 09/289,074, entitled "Electro-Chemical Deposition System" filed Apr. 8, 1999, which is incorporated by reference to the extent not inconsistent with this invention.

Alternatively, the invention contemplates the use of other deposition processes, such as chemical vapor deposition, physical vapor deposition, ionized metal plasma physical vapor deposition among others to non-selectively deposit material on the substrate surface between polishing steps to minimize or reduce dishing and recess formation in the substrate surface. An example of a chamber capable of chemical vapor deposition of a nucleation layer is a CVD TxZ™ chamber, available from Applied Materials, Inc. of Santa Clara, Calif.). An example of a chamber capable of physical vapor deposition is an IMP PVD (ionized metal plasma physical vapor deposition) process in an IMP Vectra™ chamber. The chamber is available from Applied Materials, Inc. of Santa Clara, Calif. Generally, IMP PVD involves ionizing a significant fraction of material sputtered from a metal target to deposit a layer of the sputtered material on a substrate. Powered supplied to a coil in the chamber supports the ionization of the sputtered material. The ionization enables the sputtered material to be attracted in a substantially perpendicular direction to a biased substrate surface and to deposit a layer of material with good step coverage over high aspect ratio features.

The substrate is then stored in a substrate carrier assembly 138 prior to positioning the substrate in a second polishing station 106 at step 740. The substrate is then polished at a polishing station until the second conductive material and barrier layer material is removed to a top surface of the dielectric layer or some other intermediate level of the dielectric layer at Step 750. The deposited second conductive material and barrier layer material may be removed by an abrasive containing polishing composition or an abrasive-free polishing composition on a conventional or abrasive sheet polishing pad.

This process may be performed by a polishing process which includes one or more processing steps as necessary to remove the second conductive material and the barrier layer to the dielectric layer to form a planar surface. For example, in a process with copper containing material used as the second conducting material, and which may be disposed on a portion of the barrier layer in residual amounts, the polishing process may include a first step of removing the copper containing material and a portion of the barrier layer, followed by a second step to remove the barrier layer with minimal removal of any conductive material within a substrate feature.

Suitable polishing compositions and methods for removing copper containing materials and barrier layer materials in polishing to the dielectric layer include abrasive-containing polishing compositions and abrasive-free polishing compositions, for example, EPC-5220, EPC-4220, EPC-4200, and SemiSperse 12, commercially available from Cabot Corp. of Aurora, Ill., CUS1201A, CUS1201B, available from Rodel Inc., of Newark, Del., HS-T605 and HS-T505, available from Hitachi Chemical Corp. of Japan, Cu-10K2, Cu-6.5K, and SEMICOSIL K1020, available from Planar Solutions of Adrian, Mich., Eterpol EPL 2352, EPL 1453, EPL 2315, and EPL 2313, available from Eternal Chemical Company Ltd. Of Taiwan, and Klebosol 1498–50 and Klebesol 1501–50 available from Clariant Corp. of Charlotte, N.C.

Suitable polishing compositions and methods for removing copper containing materials and barrier layer materials in polishing to the dielectric layer in two step barrier layer polishing processes are more fully described in co-pending U.S. patent application Ser. No. 09/698,864 filed on Oct. 27, 2000, and incorporated herein by reference to the extent not inconsistent with the invention.

Alternatively, depositing the second conductive material and polishing the second conductive material and the barrier layer material may be performed concurrently. For example, in the apparatus shown in FIG. 4, an electroless solution may be introduced into partial enclosure 434 via a fluid delivery line 440 having an outlet 442 positioned above the permeable disk 428. The permeable disk is a polishing pad. The second conductive material is deposited on the first conductive material from the electroless solution while a polishing pressure is applied between the substrate surface and the polishing pad to remove material therefrom. The partial enclosure may also include an anode for deposition of material on the substrate by the application of a bias to the substrate while performing a polishing process with the polishing pad. An example of a combination of electrochemical deposition and polishing process is disclosed in co-pending U.S. patent application Ser. No. 09/698,864 filed on Oct. 27, 2000, and incorporated herein by reference to the extent not inconsistent with the invention.

The substrate may then be further processed on the same or additional platen polishing station, such as by a buffing process, to minimize surface defects and scratches that may have formed in the substrate surface. Buffing involves polishing the substrate on a platen with a low application of force between the substrate surface and the polishing pad and generally using a polishing composition with a low material removal rate compared to conventional polishing processes. An example of a suitable buffing process and composition is disclosed in co-pending U.S. patent application Ser. No. 09/569,968, filed on May 11, 2000, and incorporated herein by reference to the extent not inconsistent with the invention.

Optionally, a cleaning solution may be applied to the polishing pad during or subsequent each of the polishing process to remove particulate matter and spent reagents from the polishing process as well as help minimize metal residue deposition on the polishing pads and defects formed on a substrate surface during polishing or substrate handling. Such processes can minimize undesired oxidation or other defects in copper features formed on a substrate surface.

FIGS. 8A–8D are series of schematic cross-sectional views of a substrate illustrating sequential process steps of one embodiment of the process describe herein.

Figure 8A:
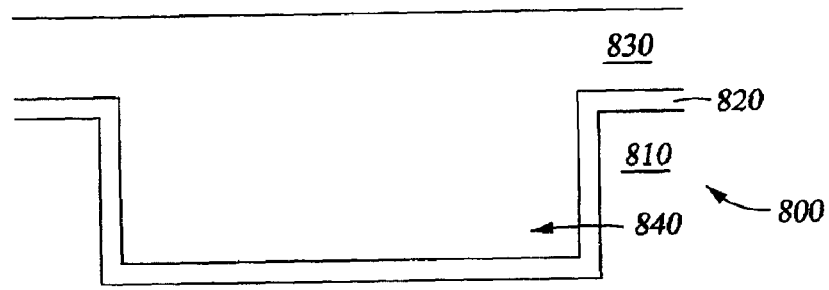
FIGS. 8A–8D are schematic diagrams illustrating one embodiment of a process for forming a feature on a substrate.

Referring to FIG. 8A, the substrate includes a dielectric layer 810, such as a silicon oxide or a carbon-doped silicon oxide, formed on a substrate 800. A plurality of openings 840 patterned and etched into the dielectric 810. The openings 840 were formed in the dielectric layer 810 by conventional photolithographic and etching techniques. A barrier layer 820 of a conductive material, such as Ta or TaN for a copper metallization, is disposed conformally in openings 840 and on the upper surface of the dielectric layer 810. A copper layer 830 is disposed on the barrier layer at a thickness (D) between about 8,000Å and about 18,000Å.

Figure 8B:
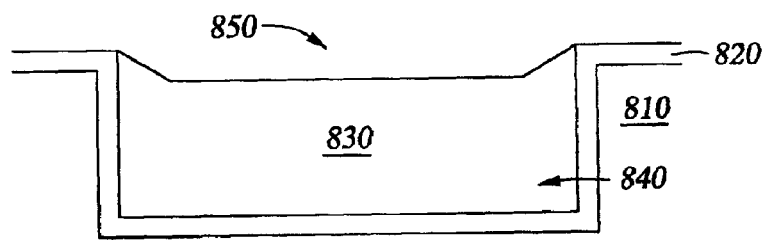

Referring to FIG. 8B, the copper layer 830 is removed using a CMP copper polishing process with an abrasive free CMP composition. The CMP composition removes the copper layer 830 to the tantalum containing barrier layer 820. Removing the copper material by a CMP composition having a selectivity of about 1:0 between copper and tantalum containing allows for effective removal of the copper layer 830 to the tantalum containing layer 820, minimizes dishing of the copper layer 830, and minimizes formation of a non-planar surface. Recesses 850 may form has formed in the copper layer 830 in the feature 840 by overpolishing of the copper layer 830.

Figure 8C:
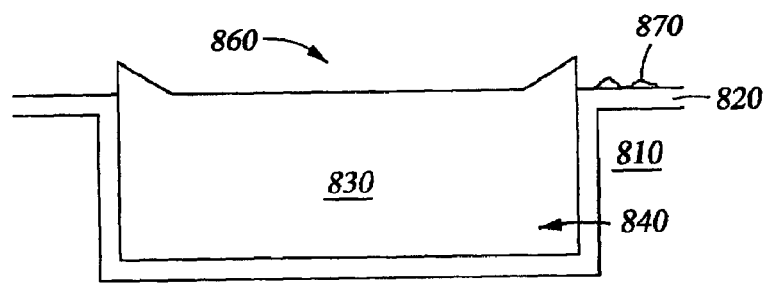

Referring to FIG. 8C, a copper material is deposited by an electroless process to overfill copper 860 in the feature 840 with a copper material. Copper material 870 may also have been deposited on the tantalum barrier layer 820 during the electroless deposition process.

Figure 8D:
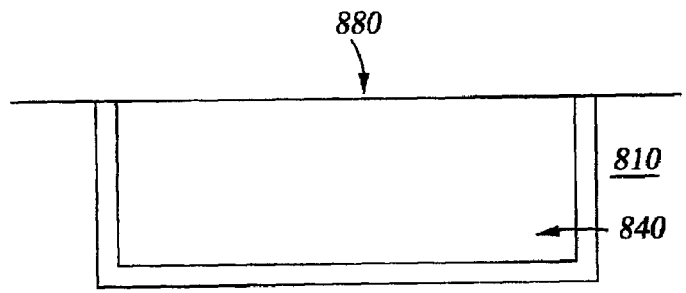

Referring to FIG. 8D, the overfill of copper 860 and the barrier layer 820 is then polished to the dielectric layer using a second composition to form a planarized surface 880. Additionally, the dielectric layer 810 may be subsequently buffed or polished during the second polishing process to remove or reduce scratching or defects formed on the substrate surface.

EXAMPLE

An example of an electrochemical deposition process and polishing processes according to aspects of the invention described herein is as follows. A substrate including a low k dielectric layer with feature definitions formed therein, a tantalum containing barrier layer conformally deposited on the low k dielectric layer and in the feature definitions formed therein, and a copper layer deposited on the barrier layer and filling the feature definitions formed therein is provided to the CMP apparatus disclosed above.

The substrate is positioned over first station, and a first polishing composition, for example, a polishing composition having a selectivity of about 1:0 between the copper and the tantalum containing layer, is delivered to the polishing pad. An example of the CMP composition includes the EPC-5003 polishing composition commercially available from Cabot Corp. of Aurora, Ill. The substrate is then polished for a requisite amount of time at a rate between about 4000 Å/minute and about 10000 Å/minute to sufficiently remove completely or substantially complete removal of the copper layer above the barrier layer. A pressure between about 0.5 psi and about 6.0 psi between the substrate and the first polishing pad is used to provide mechanical activity to the polishing process. The substrate is then polished for a requisite amount of time sufficient for complete or substantially complete removal of the copper layer above the barrier layer.

The substrate is then transferred to an electroless deposition process station and between about 20 Å and about 2000 Å of copper material is selectively deposited on the copper layer.

The substrate is then transferred to a second polishing station and a second polishing composition is provided thereto to remove the copper layer and the tantalum containing barrier layer to the dielectric layer. An example of the second polishing composition is CUS1201A or CUS1201B commercially available from Rodel Inc., of Newark, Del. The substrate is then polished at a rate up to about 1200 Å/minute to remove the barrier layer materials. A pressure between about 0.5 psi and about 6.0 psi between the substrate and the polishing pad is used to provide mechanical activity to the polishing process. The substrate is then polished for a requisite amount of time sufficient for complete or substantially complete removal of the copper containing material and the underlying barrier layer to the top surface of the dielectric layer. The substrate may then be buffed on the third hard pad and then cleaned using a suitable cleaning solution.

While the foregoing is directed to the one or more embodiments of the invention, other and further embodiments of the invention may be devised without departing from the basic scope thereof, and the scope thereof is determined by the claims that follow including their equivalents.

What is claimed is:

1. A method for processing a substrate, comprising:
   providing a substrate with feature definitions formed in a dielectric material;
   depositing a barrier layer material on a substrate surface and in the feature definitions;
   depositing a first conductive material on the barrier layer material to fill the feature definitions;
   polishing the first conductive material to a top surface of the barrier layer material;
   depositing a second conductive material by an electrochemical deposition technique on at least the first conductive material to fill recesses formed in the first conductive material; and polishing the second conductive material and the barrier layer material to at least a top surface of the dielectric layer to form a planar surface.

2. The method of claim 1, wherein the first conductive material comprises copper, aluminum, tungsten, or combinations thereof.

3. The method of claim 1, wherein the second conductive material comprises a noble metal, a semi-noble metal, a group IVA metal, or combinations thereof.

4. The method of claim 1, wherein the second conductive material is selected from the group of copper, platinum, nickel, tin, cobalt, palladium, gold, silver, osmium, iridium, rhenium, ruthenium, aluminum, tungsten, and combinations thereof.

5. The method of claim 1, wherein the electrochemical deposition technique comprises an electroplating deposition technique, an electroless deposition technique, or an electrochemical mechanical plating process technique.

6. The method of claim 1, wherein the second conductive material is deposited to a thickness between about 25 Å and about 2000 Å.

7. The method of claim 1, further comprising depositing a conductive seed layer on the barrier layer material by a chemical vapor deposition technique or a physical vapor definition technique prior to depositing the first conductive material.

8. The method of claim 1, further comprising annealing the substrate.

9. The method of claim 1, further comprising rinsing the substrate after each polishing process.

10. The method of claim 1, wherein polishing the first conductive material, depositing the second conductive material, and polishing the second conductive material and the barrier layer material are performed in the same, polishing system.

11. The method of claim 1, wherein depositing the second conductive material and polishing the second conductive material and the barrier layer material are performed concurrently.

12. A method for planarizing a substrate surface, comprising:

providing a substrate to a polishing station disposed on a processing system, wherein the substrate comprises a dielectric material with substrate feature definitions formed therein, a barrier layer material disposed thereon and within the feature definitions, and a copper material disposed on the barrier layer material;

polishing a copper material from the substrate surface to a top surface of the barrier layer material;

transferring the substrate to an electrochemical deposition and polishing station disposed on the polishing system;

depositing a conductive material on the copper containing material by an electroless deposition technique while removing the conductive material and the barrier layer material to at least a top surface of the dielectric layer by a polishing technique.

13. The method of claim 12, wherein the conductive material is deposited to a thickness between about 25 Å and about 2000 Å.

14. The method of claim 12, wherein the conductive material is selected from the group of a noble metal, a semi-noble metal, a group IVA metal, and combinations thereof.

15. The method of claim 12, wherein the conductive material is selected from the group of copper, platinum, nickel, tin, cobalt, palladium, gold, silver, osmium, iridium, rhenium, ruthenium, aluminum, tungsten, and combinations thereof.

16. The method of claim 12, further comprising annealing the substrate after polishing the second conductive material and the barrier layer material to the top surface of the dielectric layer.

17. The method of claim 12, further comprising rinsing the substrate after each polishing process.

18. The method of claim 1, wherein the electrochemical deposition technique is an electroless deposition technique and the first conductive material and the second conductive material are copper.

19. The method of claim 1, wherein the electrochemical deposition technique is an electroplating deposition technique and the first conductive material and the second conductive material are copper.

20. The method of claim 1, wherein the first conductive material is different from the second conductive material.

21. The method of claim 1, wherein the first conductive material is the same as the second conductive material.

22. The method of claim 1, wherein the second conductive material is selectively deposited on the first conductive material in recess as compared to the barrier layer material.

23. The method of claim 1, wherein polishing the first conductive material and depositing the second conductive material are performed concurrently by an electrochemical mechanical plating technique.

24. A method for planarizing a substrate surface, comprising:

providing a substrate to a polishing station disposed on a processing system, wherein the substrate comprises a dielectric material with substrate feature definitions formed therein, a barrier layer material disposed thereon and within the feature definitions, and a copper material disposed on the barrier layer material;

polishing a copper material from the substrate surface to a top surface of the barrier layer material;

depositing a conductive material on the copper material by an electrochemical deposition technique;

polishing the conductive material and the barrier layer material to at least a top surface of the dielectric layer by a polishing technique.

25. The method of claim 24, wherein the electrochemical deposition technique comprises an electroplating deposition technique, an electroless deposition technique, or an electrochemical mechanical plating technique.

26. The method of claim 24, wherein polishing the copper material and depositing the second conductive material are performed concurrently by an electrochemical mechanical plating technique.

27. The method of claim 24, wherein the electrochemical deposition technique is an electroless deposition technique and the conductive material is copper.

28. The method of claim 24, wherein the electrochemical deposition technique is an electroplating deposition technique and the conductive material is copper.

29. The method of claim 24, wherein the conductive material is not copper.

30. The method of claim 24, wherein the conductive material is selected from the group of copper, platinum, nickel, tin, cobalt, palladium, gold, silver, osmium, iridium, rhenium, ruthenium, aluminum, tungsten, and combinations thereof.

31. The method of claim 24, wherein the second conductive material is selectively deposited on the first conductive material in recess as compared to the barrier layer material.

* * * * *